United States Patent
Tolbert et al.

(10) Patent No.: US 7,330,240 B2
(45) Date of Patent: *Feb. 12, 2008

(54) IMAGING SYSTEM FOR THERMAL TRANSFER

(75) Inventors: William A. Tolbert, Woodbury, MN (US); James M. Nelson, Lino Lakes, MN (US); Thomas A. Isberg, Minneapolis, MN (US); Andrew L. Hightower, Eden Prairie, MN (US); Dean Faklis, Bloomfield, NY (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/464,643

(22) Filed: Aug. 15, 2006

(65) Prior Publication Data

US 2006/0274296 A1    Dec. 7, 2006

Related U.S. Application Data

(63) Continuation of application No. 10/863,938, filed on Jun. 9, 2004, now Pat. No. 7,148,957.

(51) Int. Cl.
  *G03B 27/54* (2006.01)
  *G03C 8/00* (2006.01)
  *B41J 2/45* (2006.01)
  *B41J 2/47* (2006.01)

(52) U.S. Cl. .................. 355/67; 430/200; 347/238; 347/239

(58) Field of Classification Search ............ 355/67, 355/71; 347/171, 193, 217, 238, 239, 241, 347/255, 256, 262; 430/200, 201, 321, 396
See application file for complete search history.

(56) References Cited

U.S. PATENT DOCUMENTS

| 2,403,731 | A | 7/1946 | MacNeille |
| 4,232,969 | A | 11/1980 | Wilczynski |
| 4,376,568 | A | 3/1983 | Sprague |
| 4,661,679 | A | 4/1987 | Pardee |
| 4,923,772 | A | 5/1990 | Kirch et al. |
| 4,924,257 | A | 5/1990 | Jain |

(Continued)

FOREIGN PATENT DOCUMENTS

| WO | WO02/47915 | 6/2002 |
| WO | WO02/052343 | 7/2002 |

*Primary Examiner*—Alan Mathews
(74) *Attorney, Agent, or Firm*—Robert S. Moshrefzadeh

(57) ABSTRACT

An optical imaging system is disclosed for selective thermal transfer of a material from a donor film to a substrate. The imaging system includes a light source assembly that is configured to emit a patterned light beam. The patterned light beam includes a plurality of discrete output light segments where the segments at most partially overlap. The imaging system further includes a light relay assembly that receives and projects the plurality of discrete output light segments onto a transfer plane so as to form a projected light segment by a substantial superposition of the plurality of discrete output light segments. When a donor film that includes a transferable material is placed proximate a substrate that lies in the transfer plane, the projected light segment is capable of inducing a transfer of the transferable material onto the substrate.

5 Claims, 13 Drawing Sheets

U.S. PATENT DOCUMENTS

| | | |
|---|---|---|
| 5,066,962 A | 11/1991 | Sarraf |
| 5,142,120 A | 8/1992 | Hanson et al. |
| 5,155,623 A | 10/1992 | Miller et al. |
| 5,168,401 A | 12/1992 | Endriz |
| 5,285,236 A | 2/1994 | Jain |
| 5,291,240 A | 3/1994 | Jain |
| 5,308,737 A | 5/1994 | Bills et al. |
| 5,326,619 A | 7/1994 | Dower et al. |
| 5,333,077 A | 7/1994 | Legar et al. |
| 5,360,694 A | 11/1994 | Thien et al. |
| 5,517,359 A | 5/1996 | Glebart |
| 5,521,035 A | 5/1996 | Wolk et al. |
| 5,521,748 A | 5/1996 | Sarraf |
| 5,530,516 A | 6/1996 | Sheets |
| 5,619,245 A | 4/1997 | Kessler et al. |
| 5,695,907 A | 12/1997 | Chang |
| 5,717,450 A | 2/1998 | Hutt et al. |
| 5,721,606 A | 2/1998 | Jain |
| 5,725,989 A | 3/1998 | Chang et al. |
| 5,745,153 A | 4/1998 | Kessler et al. |
| 5,747,217 A | 5/1998 | Zaklika et al. |
| 5,750,212 A | 5/1998 | Kickelhain |
| 5,756,236 A | 5/1998 | Cordes et al. |
| 5,766,827 A | 6/1998 | Bills et al. |
| 5,793,783 A | 8/1998 | Endriz |
| 5,802,092 A | 9/1998 | Endriz |
| 5,827,622 A | 10/1998 | Coufal et al. |
| 5,828,455 A | 10/1998 | Smith et al. |
| 5,844,727 A | 12/1998 | Partlo |
| 5,877,800 A | 3/1999 | Robinson et al. |
| 5,897,986 A | 4/1999 | Dunn et al. |
| 5,900,981 A | 5/1999 | Oren et al. |
| 5,923,475 A | 7/1999 | Kurtz et al. |
| 5,935,758 A | 8/1999 | Patel et al. |
| 5,978,071 A | 11/1999 | Miyajima et al. |
| 5,995,475 A | 11/1999 | Gelbart |
| 5,998,085 A | 12/1999 | Isberg et al. |
| 6,064,528 A | 5/2000 | Simpson, Jr. |
| 6,096,461 A | 8/2000 | Gelbart |
| 6,107,011 A | 8/2000 | Gelbart |
| 6,114,088 A | 9/2000 | Wolk et al. |
| 6,137,631 A | 10/2000 | Moulin |
| 6,169,565 B1 | 1/2001 | Ramanujan et al. |
| 6,194,119 B1 | 2/2001 | Wolk et al. |
| 6,208,371 B1 | 3/2001 | Miyagawa et al. |
| 6,211,997 B1 | 4/2001 | Nutt et al. |
| 6,346,979 B1 | 2/2002 | Ausschnitt et al. |
| 6,366,339 B1 | 4/2002 | Gelbart |
| 6,396,618 B1 | 5/2002 | Esener et al. |
| 6,407,849 B1 | 6/2002 | Steinblatt |
| 6,486,997 B1 | 11/2002 | Bruzzone et al. |
| 6,573,986 B2 | 6/2003 | Smith et al. |
| 6,580,491 B2 | 6/2003 | Hall et al. |
| 6,580,494 B1 | 6/2003 | Hall et al. |
| 6,582,875 B1 | 6/2003 | Kay et al. |
| 6,593,064 B1 | 7/2003 | Glebart |
| 6,602,790 B2 | 8/2003 | Kian et al. |
| 6,646,669 B2 | 11/2003 | Gelbart |
| 6,654,183 B2 | 11/2003 | Coufal et al. |
| 6,661,498 B1 | 12/2003 | Hirukawa |
| 7,148,957 B2 * | 12/2006 | Tolbert et al. ................ 355/67 |
| 2002/0160296 A1 | 10/2002 | Wolk et al. |
| 2003/0095317 A1 | 5/2003 | Gelbart et al. |
| 2003/0113656 A1 | 6/2003 | Tyan et al. |
| 2003/0148208 A1 | 8/2003 | Phillips et al. |
| 2003/0180638 A1 | 9/2003 | Tyan |
| 2004/0002016 A1 | 1/2004 | Rivers et al. |

* cited by examiner

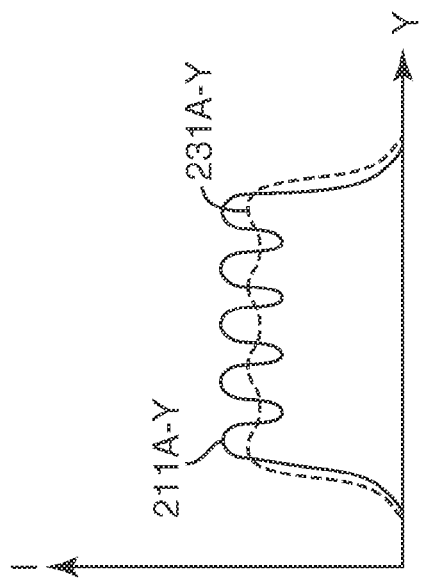
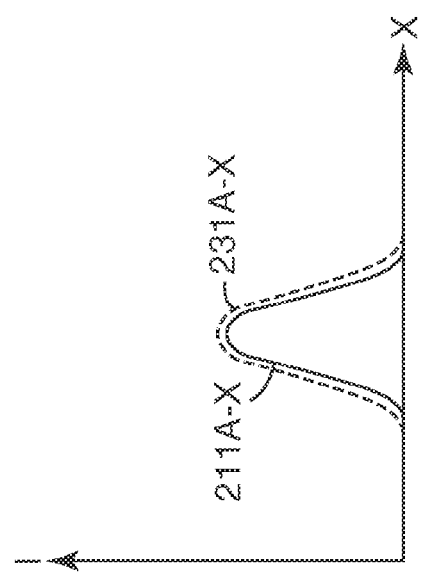
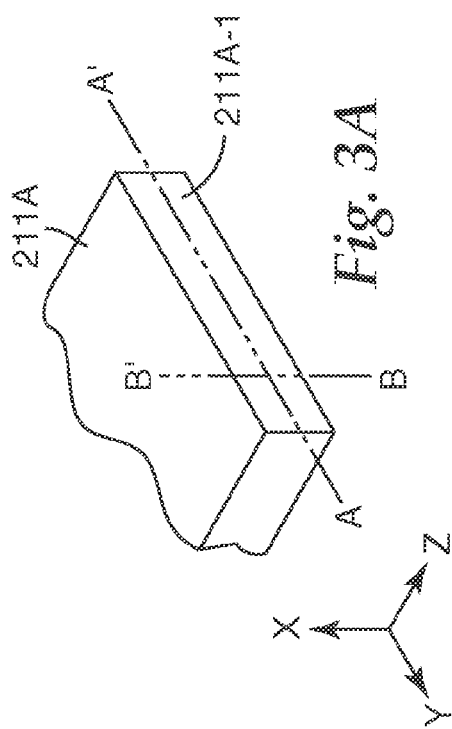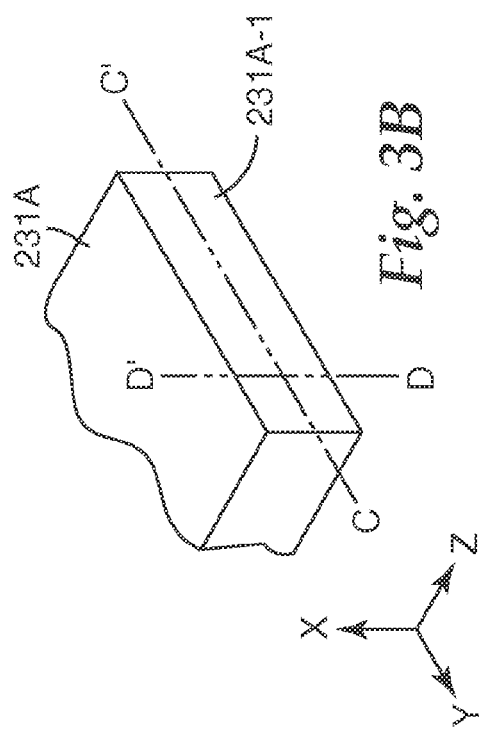

IMAGING SYSTEM FOR THERMAL TRANSFER

CROSS REFERENCE TO RELATED APPLICATIONS

This application is a continuation of U.S. application Ser. No. 10/863,938, filed Jun. 9, 2004, now U.S. Pat. No. 7,148,957.

FIELD OF THE INVENTION

This invention generally relates to imaging systems. In particular, the invention relates to laser induced thermal imaging systems for transferring a material from a donor film to a substrate.

BACKGROUND

Pixelated displays are commonly used for displaying information. Examples include liquid crystal computer monitors and televisions, and organic light emitting displays used in applications such as cell phones, and portable digital video displays. The pixels in a display can be patterned using a variety of methods, such as photolithography, photoablation, and laser induced thermal imaging (LITI). LITI has been particularly applicable in patterning organic materials in organic electronic displays or devices.

SUMMARY OF THE INVENTION

Generally, the present invention relates to imaging systems.

In one embodiment of the invention, an optical imaging system for selective thermal transfer of a material from a donor film to a substrate includes a light source assembly that is configured to emit a patterned light beam. The patterned light beam includes a plurality of discrete output light segments where the segments at most partially overlap. The optical imaging system further includes a light relay assembly that receives and projects the plurality of discrete output light segments onto a transfer plane so as to form a projected light segment by a substantial superposition of the plurality of discrete output light segments. When a donor film that includes a transferable material is placed proximate a substrate that lies in the transfer plane, the projected light segment is capable of inducing a transfer of the transferable material onto the substrate.

In another embodiment of the invention, an optical imaging system for selective thermal transfer of a material from a donor film to a substrate includes a light source assembly that is configured to emit a patterned light beam. The patterned light beam includes an output array of discrete output light segments. The output array has n columns and m rows, n being greater than 1. The discrete output light segments in a column at most partially overlap. The optical imaging system further includes a light relay assembly that receives and projects the output array onto a transfer plane so as to form a projected array of discrete projected light segments in the transfer plane. The projected array has n columns and one row. Each discrete projected light segment in a projected column is formed by a substantially full overlap of the discrete output light segments in a corresponding column of the output array, such that when a donor film that includes a transferable material and is disposed proximate a carrier, is placed proximate a substrate that lies in the transfer plane, each of the discrete projected light segments is capable of inducing a transfer of the transferable material from the carrier onto the substrate.

In another embodiment of the invention, an optical imaging system for selective thermal transfer of a material from a donor film to a substrate includes a light source that is capable of emitting a patterned light beam. The patterned light beam includes two or more emitted light segments. Each emitted light segment has a first uniformity along a first direction. The optical imaging system further includes a light homogenizer that receives the two or more emitted light segments and homogenizes each emitted light segment and transmits a corresponding homogenized light segment. Each transmitted homogenized light segment has a third uniformity along the first direction. The third uniformity of each transmitted homogenized light segment is greater than the first uniformity of each corresponding emitted light segment. The optical imaging system further includes a mask that receives each of the transmitted homogenized light segments and patterns each transmitted homogenized light segment into a row of n discrete light subsegments along the first direction. n is greater than twenty. Each discrete light subsegment has a length along the first direction. The mask is capable of setting the length of each discrete light subsegment at any value in a range from about 50 microns to about 150 microns with an accuracy of one micron or better. The optical imaging system further includes a substrate. The optical imaging system further includes a first lens system that projects each row of n discrete light subsegments onto the substrate with a projection magnification of one along the first direction, thereby forming a single row of n discrete projected light segments along the first direction. The distance between the first and the nth discrete projected light segments is at least 10 mm. When a donor film that includes a transferable material and is disposed proximate a carrier, is placed proximate the substrate between the first lens and the substrate, each of the n discrete projected light segments is capable of inducing a transfer of the transferable material from the carrier onto the substrate.

In another embodiment of the invention, an optical imaging system for selective thermal transfer of a material from a donor film to a substrate includes a light source that includes two or more sets of light bar assemblies. Each set of light bar assembly includes two or more light bars. Each light bar in the set is capable of emitting polarized light. A first polarization direction of polarized light emitted from at least one light bar in the set is different than a second polarization direction of polarized light emitted from at least another light bar in the set. A polarizing beam combiner uses the difference between the first and second polarization directions to combine polarized light emitted from the two or more light bars in the set to form a combined emitted light beam. A spatial filter combines the combined emitted light beams from the two or more sets of light emitters by reflecting at least a combined emitted light beam from one set of light emitters and transmitting at least a combined emitted light beam from another set of light emitters. The combination of the combined emitted light beams form a patterned light beam. The patterned light beam includes one or more emitted light segments. Each emitted light segment has a first uniformity along a third direction. The optical imaging system further includes a light homogenizer that receives the one or more emitted light segments and homogenizes each emitted light segment and transmits a corresponding homogenized light segment. Each transmitted homogenized light segment has a third uniformity along the third direction. The third uniformity of each transmitted homogenized light segment is greater than the first uniformity of each corresponding emitted light segment. The optical imaging system further includes a mask that receives and patterns each of the transmitted homogenized light segments into a row of n discrete light subsegments along the third direction. n is greater than twenty. Each discrete light subsegment has a length along the third direction. The mask is capable of setting the length of each discrete light subsegment at any value in a range from about 50 microns to about 150 microns with an accuracy of one micron or better. The optical imaging system further includes a substrate. The optical imaging system further includes a first lens system that projects each row of n discrete light subsegments onto the substrate with a projection magnification of one along the third direction, thereby forming a single row of n discrete projected light segments along the third direction. The distance between the first and the nth discrete projected light segments is at least ten millimeters. When a donor film that includes a transferable material that is disposed proximate a carrier, is placed proximate the substrate between the first lens and the substrate, each of the n discrete projected light segments is capable of inducing a transfer of the transferable material from the carrier onto the substrate.

BRIEF DESCRIPTION OF DRAWINGS

The invention may be more completely understood and appreciated in consideration of the following detailed description of various embodiments of the invention in connection with the accompanying drawings, in which:

FIGS. 3A and 3B illustrate a schematic three-dimensional view of an emitted light segment before and after passing through a homogenizer, respectively;

FIGS. 4A and 4B illustrate beam uniformity along two different directions, for the emitted light segments shown in FIGS. 3A and 3B;

Figure 1:
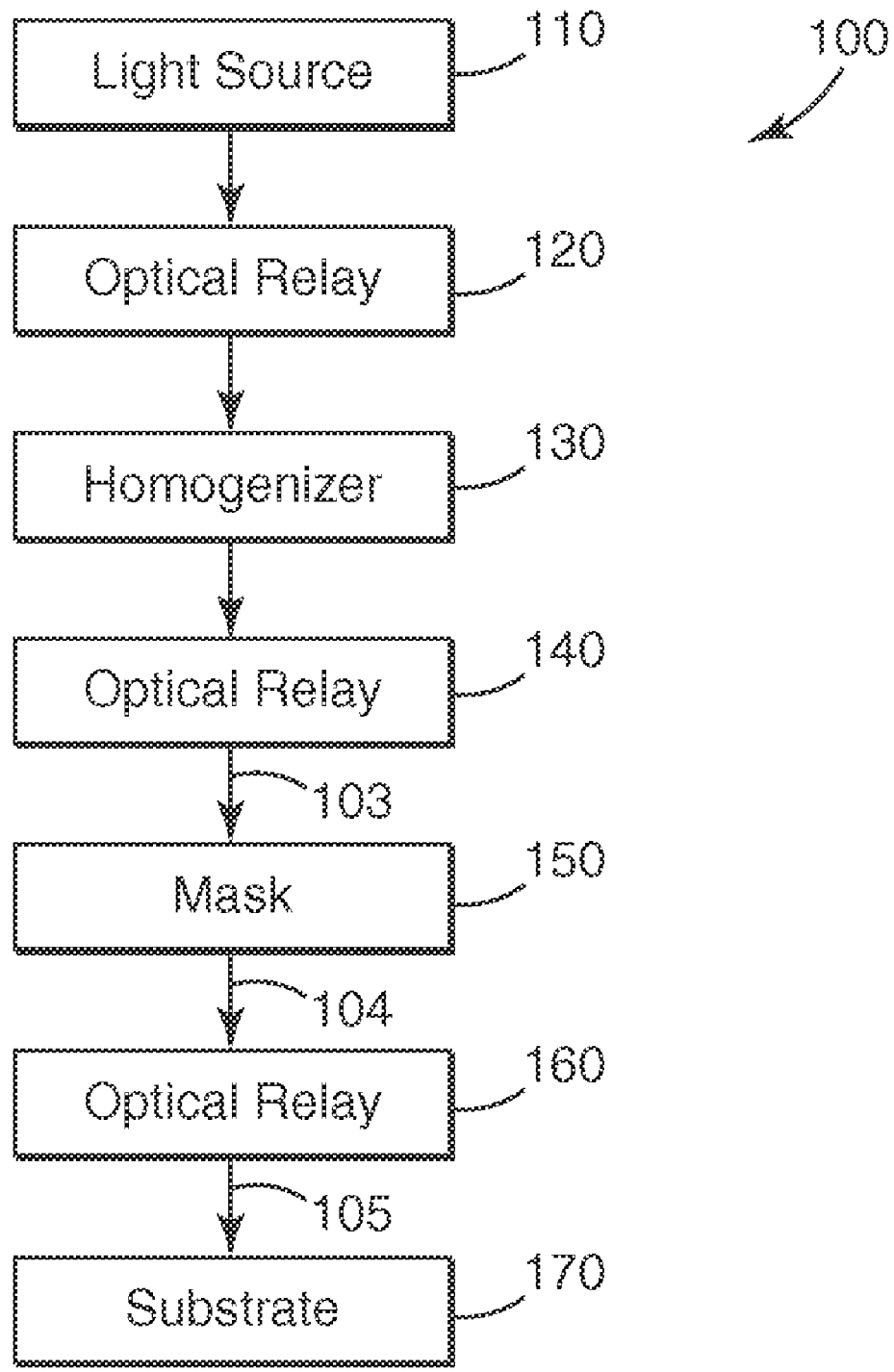
FIG. 1 illustrates a block diagram of an imaging system in accordance with one embodiment of the invention.

It will be appreciated that unless otherwise noted, the various drawings are not drawn to scale.

DETAILED DESCRIPTION

The present invention generally applies to imaging systems. The invention is particularly applicable to laser induced thermal imaging systems for patterning pixels in a display where it is desirable to accomplish the patterning in a short amount of time to reduce, for example, the processing cost.

In the specification, a same reference numeral used in multiple figures refers to same or similar elements having same or similar properties and functionalities.

Figure 24:
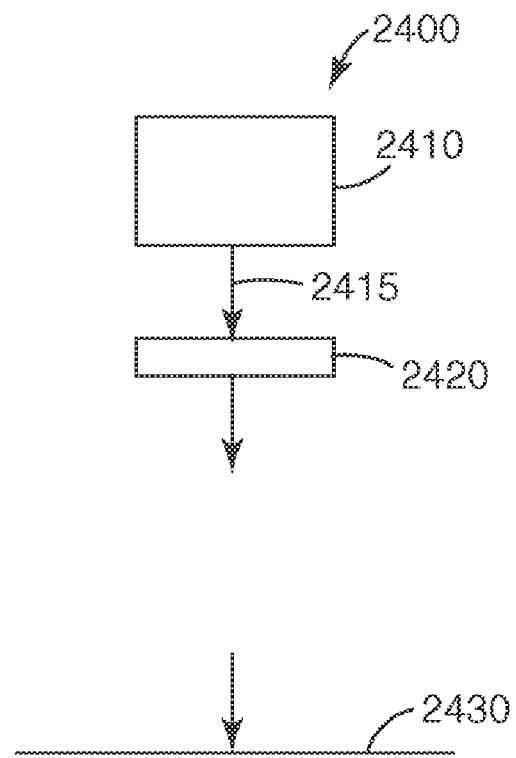
FIG. 24 illustrates a block diagram of an imaging system in accordance with one embodiment of the invention.

FIG. 24 illustrates a block diagram of an imaging system 2400 in accordance with one embodiment of the invention. Imaging system 2400 includes a light source assembly 2410 and a light relay assembly 2420.

In one particular embodiment of the invention, output light 2415 of light source assembly 2410 includes a patterned light beam where the pattern includes a plurality of discrete output light segments. The discrete light segments can be isolated from each other, meaning that there is little or no overlap between any two segments. In general, any two discrete output light segments at most partially overlap. Light relay assembly 2420 receives and projects the plurality of discrete output light segment onto transfer plane 2430 so as to form a projected light segment by a substantial superposition of the plurality of discrete output light segments. The power of the projected light segments can be close to a sum of the powers of the plurality of discrete output light segments. Furthermore, when a donor film that includes a transferable material disposed proximate a carrier, is placed proximate a substrate that lies in transfer plane 2430, the projected light segment is capable of inducing a transfer of the transferable material from the carrier onto the substrate.

In another embodiment of the invention, output light 2415 of light source assembly 2410 includes a patterned light beam where the pattern includes an output array of discrete output light segments, the output array having n columns and m rows, n being greater than 1. m can be greater than 1. The discrete output light segments in an array column can be isolated from each other. In general, any two output light segments in an array column at most partially overlap. Light relay assembly 2420 receives and projects the output array onto transfer plane 2430 so as to form a projected array of discrete projected light segments in the transfer plane. The projected array has n columns and a single row where each discrete projected light segment in a column is formed by a substantially full overlap of the discrete output light segments in a corresponding column of the output array. When a donor film that includes a transferable material disposed proximate a carrier, is placed proximate a substrate that lies in the transfer plane, each of the discrete projected light segments is capable of inducing a transfer of the transferable material from the carrier onto the substrate.

In another embodiment of the invention, output light 2415 of light source assembly 2410 includes a two-dimensional output array of discrete light subsegments, where the output array has n columns and m rows, n being greater than 1. The m rows are divided into p groups, each group including at least two rows of discrete light subsegments, where no row is included in more than one group. Light relay assembly 2420 transfers the m by n array of discrete light subsegments onto transfer plane 2430 by superposing all the rows in each group so as to form a projected array of projected light segments in transfer plane 2430, where the projected array has n columns and p rows. Each projected light segment is capable of inducing a transfer of a transferable material that is coated on a carrier and placed proximate a substrate that lies in transfer plane 2430. In the case where p is 1, the m rows are substantially fully superposed forming a single row of n projected light segments.

FIG. 1 shows an exemplary block diagram of an imaging system 100 in accordance to one aspect of the present invention where each block describes a different component or sub-assembly in the imaging system. The imaging systems of the present invention need not necessarily include all the blocks shown in FIG. 1. Furthermore, an imaging system according to the present invention may have additional blocks not shown in FIG. 1. Imaging system 100 includes a light source 110, a first optical relay 120, a light homogenizer 130, a second optical relay 140, a mask 150, a third optical relay 160, and a substrate 170.

Imaging system 100 projects light provided by light source 110 onto substrate 170 so that, for example, the projected light is capable of inducing a transfer of a transferable material that is coated on a carrier and placed proximate substrate 170, from the carrier onto substrate 170.

Imaging system 100 can be used to selectively transfer, and therefore, pattern a display component. For example, imaging system 100 may be used to transfer emissive materials, color filters (e.g., red, green, and blue), black matrix, electrodes, transistors, insulators, and spacers onto a display substrate. An important characteristic of imaging system 100 according to one embodiment of the present invention is high throughput where throughput is the number of displays or display components patterned in a given unit of time, such as one hour. As such, throughput relates to the time required to pattern various display components, such as color filters and black matrix. A high throughput is generally desirable because it can result in lower processing manufacturing costs, and hence, a less expensive final display product.

According to one embodiment of the invention, a characteristic of imaging system 100 that is of particular importance in increasing throughput is light intensity at substrate 170. In general, the intensity of light 105 at substrate 170 needs to be higher than a threshold value in order to induce a material transfer. Furthermore, for light intensities above the threshold value, a higher light intensity generally results in a reduction in time required to transfer a material, such as a color filter material, from a donor film onto, say, a display substrate. As such, a light 105 having high intensity or power can increase the overall throughput. The present invention provides various embodiments that are capable of significantly increasing the throughput by delivering high beam intensities at substrate 170.

Another important characteristic of imaging system 100 according to one embodiment of the invention is beam uniformity, especially at substrate 170. A non-uniform light 105 can result in, for example, partial or no transfer of a transferable material, or damage to the transferable material or a nearby element. As such, a function of homogenizer 130 according to one embodiment of the present invention is to improve beam uniformity in one or more directions.

Imaging system 100 further includes a mask 150 for receiving and patterning an incident light 103 into an output light 104 patterned in a desired pre-determined pattern or shape. Preferably, a light pattern produced by mask 150 substantially matches, at least within a scaling factor, a corresponding pixel design on a display so that all eventual transfers induced by the light pattern occur at intended locations resulting in good registration between the transfer and intended locations.

Imaging system 100 further includes a number of optical relays (for example, as shown, a first optical relay 120, a second optical relay 140, and a third optical relay 160). Each of these optical relays is, at least in part, intended to transfer light from a previous block or sub-assembly to a next block or sub-assembly. For example, third optical relay 160 may be primarily designed to project light that is patterned by mask 150 onto substrate 170. As another example, first optical relay 120 may be designed primarily to transfer light that is emitted by light source 110 to homogenizer 130. Each optical relay may include components such as lenses, mirrors, retarders, beam splitters, beam combiners, and beam expanders. Furthermore, one or more of the optical relays may also perform other functions such as collimation, magnification, imaging, focusing, or reduction in aberrations.

Figure 2:
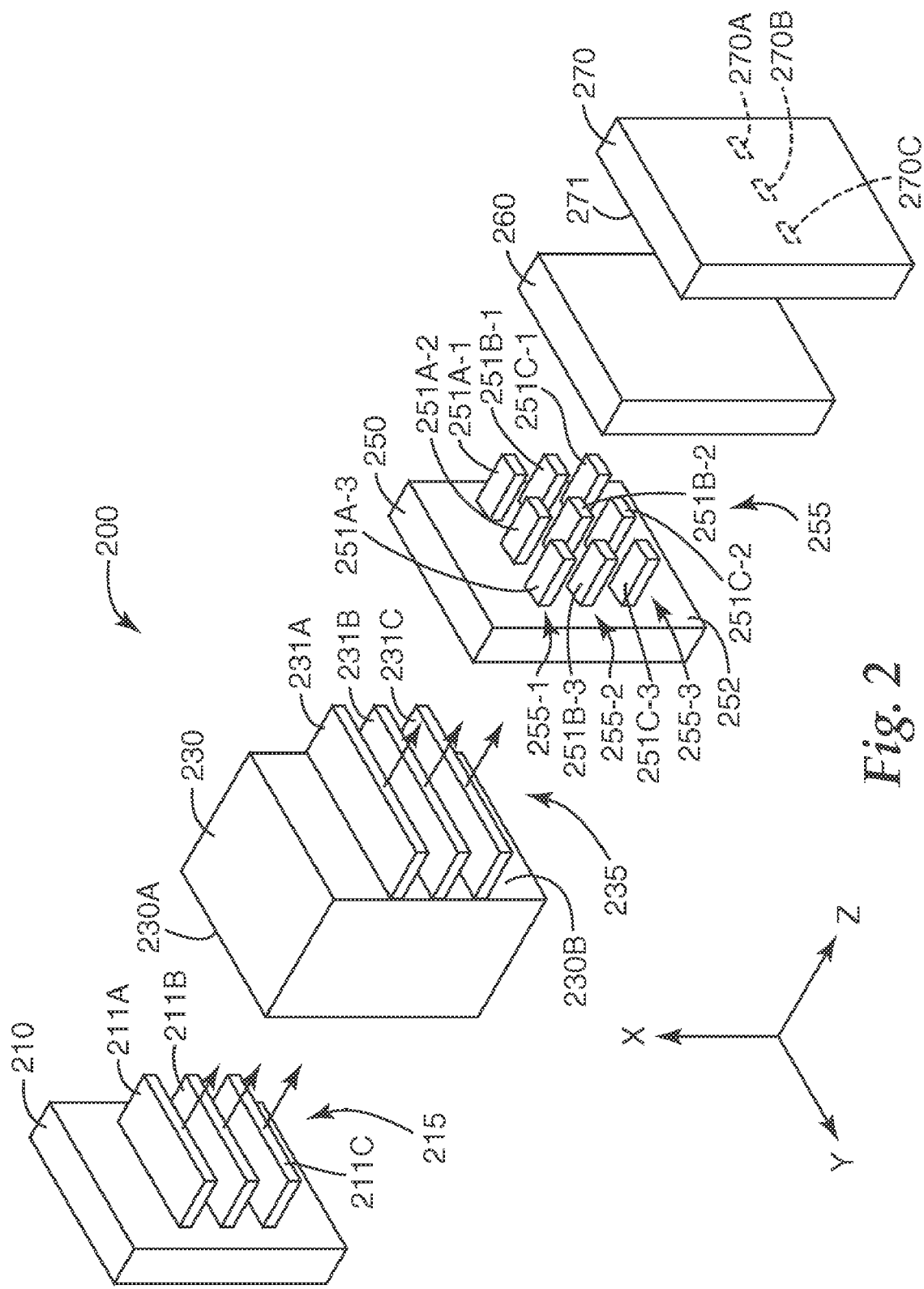
FIG. 2 illustrates a schematic three-dimensional view of an imaging system in accordance with one embodiment of the invention.

FIG. 2 illustrates a schematic three-dimensional view of an imaging system 200 in accordance with one particular embodiment of the invention. Imaging system 200 includes a light source 210, a homogenizer 230, a mask 250, a lens system 260, and a substrate 270.

Light source 210 emits a patterned light beam 215 that generally propagates along a direction, such as the z-axis. Patterned light beam 215 includes one or more emitted light segments. In the particular example shown in FIG. 2, patterned light beam 215 includes three emitted light segments 211A, 211B, and 211C, where each emitted light segment propagates along the z-axis and has a finite extent along at least one direction that is normal to the direction of propagation of the light segment. In particular, each emitted light segment has a finite extent along at least one of x- and y-directions for a direction of propagation along the z-axis. In the exemplary embodiment shown in FIG. 2, each of emitted light segments 211A, 211B, and 211C has finite extent along both x- and y-directions. Each emitted light segment can have different intensity or beam uniformity profiles along different directions. In particular, each of emitted light segments 211A, 211B, and 211C has a beam uniformity profile along the x-axis and a beam uniformity profile along the y-axis, where x-, y-, and z-directions are mutually perpendicular to each other as shown in FIG. 2. In addition, each emitted light segment can diverge, converge, or remain substantially collimated as it propagates along the z-axis. As such, each of emitted light segments 211A, 211B, and 211C has a divergence angle along the x-axis and a divergence angle along the y-axis. In the invention, divergence of a light beam refers to an angular spread of the light beam at its full width at half intensity maximum (FWHM). Divergence and beam uniformity of each emitted light segment is further described in reference to FIGS. 3-5.

FIG. 3A shows a portion of emitted light segment 211A. A cross-section of emitted light segment 211A in the xy-plane, such as cross-section 211A-1, can have a uniformity profile along the y-axis (direction AA') and a uniformity profile along the x-axis (direction BB'). FIG. 4A shows uniformity profile 211A-y of emitted light segment 211A (in cross-section 211A-1) along the y-axis. Similarly, FIG. 4B shows uniformity profile 211A-x of emitted light segment 211A (in the same cross-section 211A-1) along the x-axis. The vertical axes in FIGS. 4A and 4B represent light intensity denoted by the letter I. The horizontal and vertical axes in FIGS. 4A and 4B are not drawn to scale. In the examples shown in FIGS. 4A and 4B, emitted light segment 211A has a fairly non-uniform intensity profile 211A-y along the y-axis and a Gaussian intensity profile 211A-x along the x-axis. Emitted light segment 211A can have other intensity profiles along the x-axis such a flat-top or uniform profile, or any other profile that may be advantageous in an imaging application. Furthermore, imaging system 200 may include an optical device to convert one intensity profile into another intensity profile. For example, imaging system 200 may include an optical device to convert a Gaussian intensity profile into a uniform or flat-top intensity profile. One such optical device for transforming a non-uniform intensity profile, such as a Gaussian profile, into a uniform intensity profile is disclosed in U.S. Pat. No. 6,654,183.

Figure 5A:
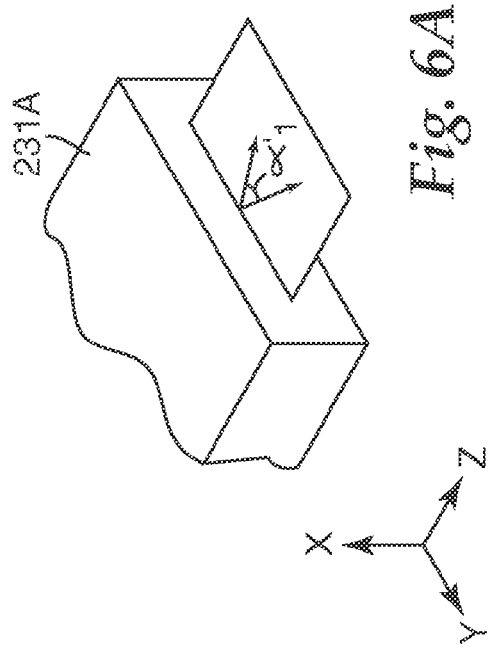
FIGS. 5A and 5B illustrate divergence of an emitted light segment along two different directions.
Figure 5B:
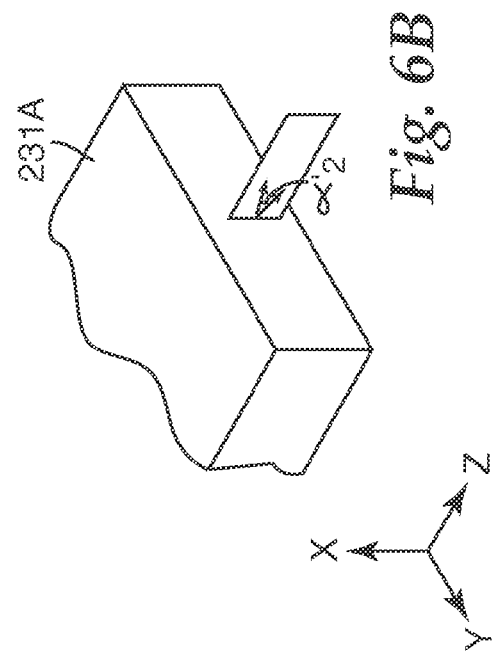

FIGS. 5A and 5B illustrate divergence of emitted light segment 211A along two different directions. In particular, FIG. 5A illustrates divergence of emitted light segment 211A in the y-z plane, or the divergence along the y-direction as the light segment propagates along the z-axis. $\alpha_1$ is the full divergence angle of emitted light segment 211A along the y-axis. Similarly, FIG. 5B illustrates divergence of emitted light segment 211A in the x-z plane, or the divergence along the x-direction as the light segment propagates along the z-axis. $\alpha_2$ is the full divergence angle of emitted light segment 211A along the x-axis.

Referring back to FIG. 2, homogenizer 230 receives patterned light 215 from its input face 230A. Homogenizer 230 is designed, at least in part, to improve beam uniformity of each emitted light segment of received patterned light 215 in one or more directions. In particular, homogenizer 230 is primarily designed to improve uniformity of each received emitted light segment along the y-axis. For example, homogenizer 230 is designed to improve uniformity of emitted light segment 211A (within the extent of the light segment) along the y-axis, which is the intensity profile 211A-y shown in FIG. 4A. Each of emitted light segments 211A, 211B, and 211C is homogenized by homogenizer 230 along y-axis. Although homogenizer 230 may homogenize a received emitted light segment along more than one direction, in one particular embodiment of the invention, homogenizer 230 homogenizes each received emitted light segment along the y-direction, but not along the x-direction. As such, according to one particular embodiment of the invention, homogenizer 230 homogenizes patterned light beam 215 along a first direction but not along a second direction, where the first direction is different than the second direction.

Homogenizer 230 transmits each homogenized emitted light segment from its output face 230B resulting in a homogenized patterned light beam 235 that includes transmitted homogenized light segments 231A, 231B, and 231C, where light segment 231A corresponds to light segment 211A, light segment 231B corresponds to light segment 211B, and light segment 231C corresponds to light segment 211C. In the exemplary embodiment shown in FIG. 2, homogenized patterned light beam 235 propagates along the z-axis, although, in general, homogenized patterned light beam 235 may propagate in a different direction, where the change in direction (relative to patterned light beam 215) may be caused by, for example, homogenizer 230.

A cross-section of each of transmitted homogenized light segments 231A, 231B, and 231C has a beam uniformity profile along the x-axis and a beam uniformity profile along the y-axis. In addition, each transmitted homogenized light segment can diverge, converge, or remain substantially collimated as it propagates along the z-axis. As such, each of transmitted homogenized light segments 231A, 231B, and 231C has a divergence angle along the x-axis and a divergence angle along the y-axis. Divergence and beam uniformity of each transmitted homogenized light segment is further described in reference to FIGS. 3, 4, and 6.

FIG. 3B shows a portion of homogenized light segment 231A. A cross-section of homogenized light segment 231A in the xy-plane, such as cross-section 231A-1, can have a uniformity profile along the y-axis (direction CC') and a uniformity profile along the x-axis (direction DD'). FIG. 4A shows a uniformity profile 231A-y of homogenized light segment 231A (in cross-section 231A-1) along the y-axis. It can be seen that 231A-y is more uniform than 211A-y within the general extent of the light segment along the y-axis. Similarly, FIG. 4B shows uniformity profile 231A-x of light segment 231A (in the same cross-section 231A-1) along the x-axis. It can be seen that intensity profiles 211A-x and 231A-x essentially overlap. As such, homogenizer 230 has homogenized emitted light segment 211A along the y-axis, but has not significantly changed the uniformity of emitted light segment 211A along the x-axis.

According to one embodiment of the invention, the uniformity of a homogenized light segment along the y-axis is preferably at least 10 times greater, more preferably at least 20 times greater, and even more preferably at least 30 times greater, than a corresponding emitted light segment.

Figure 6A:
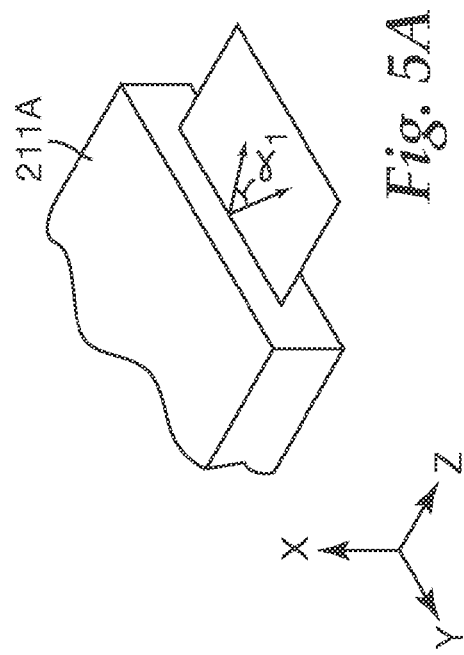
FIGS. 6A and 6B illustrate divergence of a homogenized light segment along two different directions.
Figure 6B:
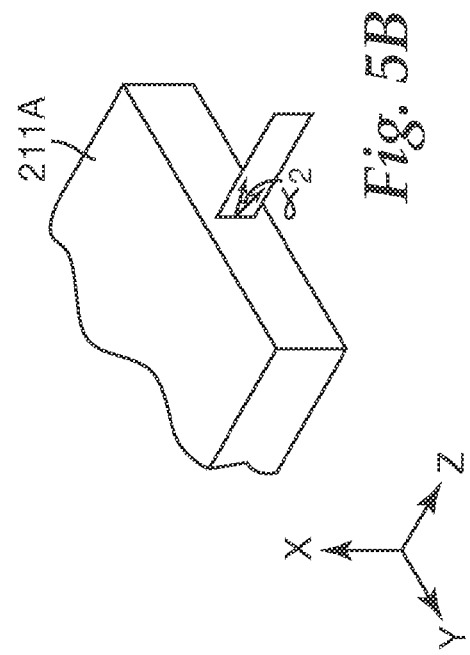

FIGS. 6A and 6B illustrate divergence of transmitted homogenized light segment 231A along two different directions. In particular, FIG. 6A illustrates divergence of transmitted homogenized light segment 231A in the y-z plane, or the divergence along the y-direction as the light segment propagates along the z-axis. $\alpha'_1$ is the full divergence angle of transmitted homogenized light segment 231A along the y-axis. Similarly, FIG. 6B illustrates divergence of transmitted homogenized light segment 231A in the x-z plane, or the divergence along the x-direction as the light segment propagates along the z-axis. $\alpha'_2$ is the full divergence angle of emitted light segment 211A along the x-axis.

Figure 23:
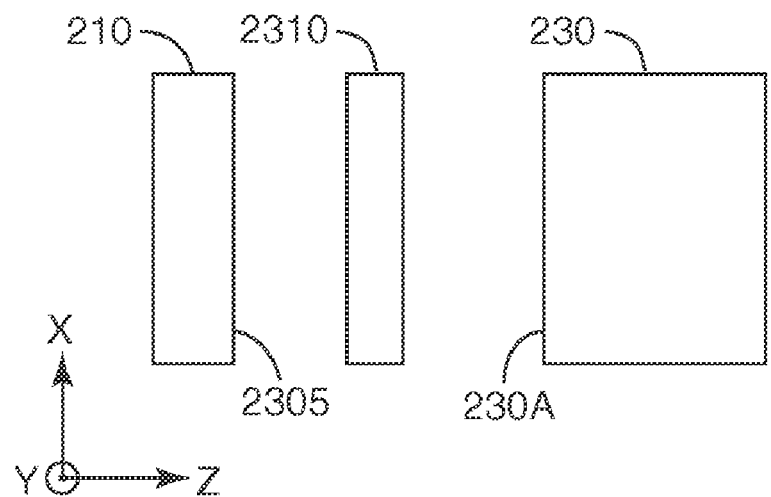
FIG. 23 illustrates a schematic side-view of a portion of an imaging system in accordance with one embodiment of the invention.

In general, $\alpha_1$ and $\alpha'_1$ need not be equal. Similarly, $\alpha_2$ and $\alpha'_2$ need not be equal. According to one aspect of the invention, however, $\alpha_2$ and $\alpha'_2$ are equal, but $\alpha_1$ and $\alpha'_1$ are not equal. As such, according to this particular aspect of the invention, homogenizer 230 changes the divergence angle of each emitted light segment along the y-direction, but not along the x-direction. According to another aspect of the invention, $\alpha_2$ and $\alpha'_2$ are equal, and $\alpha_1$ and $\alpha'_1$ are also equal. In some embodiments of the invention, as shown in FIG. 23, an optical relay 2310 (such as optical relay 120 in FIG. 1) is disposed between light source 210 and homogenizer 230. FIG. 23 illustrates a schematic side-view of a portion of an imaging system in accordance with one particular embodiment of the invention. In particular, FIG. 23 shows an optical relay 2310 disposed between light source 210 and homogenizer 230. Optical relay 2310 can primarily be designed to, for example, transfer light from light source 210 to homogenizer 230. In such cases, one or both of optical relay 2310 and homogenizer 230 may affect $\alpha_1$, $\alpha_2$, or both. According to one aspect of the invention, one or both of optical relay 2310 and homogenizer 230 change $\alpha_1$, but not $\alpha_2$. In a preferred embodiment of the invention, $\alpha'_1$, is equal to $\alpha_1$, and $\alpha'_2$ is equal to $\alpha_2$. Optical relay 2310 may have different magnification factors along the x- and y-directions. In one particular embodiment of the invention, optical relay 2310 forms an image of output face 2305 of light source 210 onto input face 230A of homogenizer 230. As such, output face 2305 and input face 230A form an object-image relation relative to optical relay 2310. In a preferred embodiment of the invention, optical relay 2310 has equal magnification factors along the x- and y-directions. In another preferred embodiment of the invention, the magnification factor of optical relay 2310 along both x- and y-directions is substantially equal to 1.

Homogenizer 230 can have any three-dimensional shape, for example, a polyhedron, such as a hexahedron. Homogenizer 230 can be solid or hollow. Homogenizer 230 may homogenize an input light by any suitable optical method such as reflection, total internal reflection, refraction, scattering, or diffraction, or any combination thereof, or any other suitable method that may be used to homogenize an input light.

Optical transmittance of Homogenizer 230 is preferably no less than 50%, more preferably no less than 70%, and even more preferably no less than 80%, where optical transmittance is the ratio of total light intensity exiting output surface 230B to total light intensity incident on input face 230A.

Figure 7:
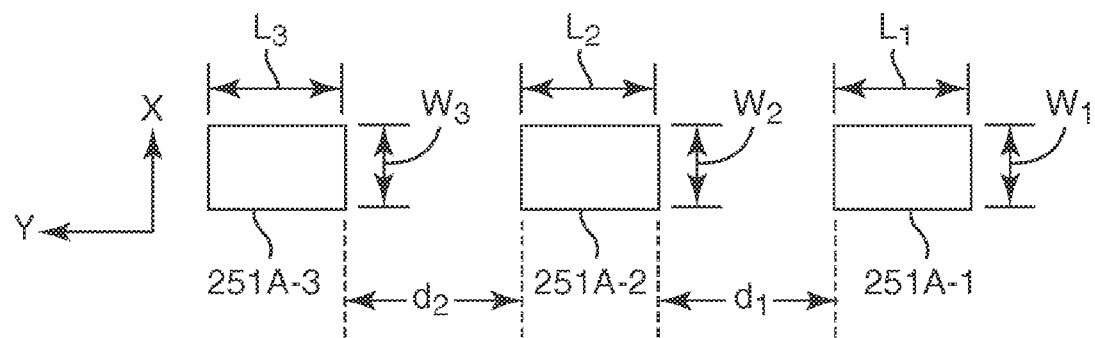
FIG. 7 illustrates a cross-sectional view of a portion of light patterned by a mask in accordance with one embodiment of the invention.

Referring back to FIG. 2, mask 250 receives each of the transmitted homogenized light segments and patterns each segment into a row of n discrete light subsegments along the y-direction, where n can be greater than one. As such, the light output of mask 250 is a mask patterned light beam 255 which includes multiple light rows (three in FIG. 2), each light row having multiple light subsegments (again, three in FIG. 2). According to the present invention, n is preferably greater than 10, more preferably greater than 20, even more preferably greater than 30, and even more preferably greater than 50. In the exemplary embodiment shown in FIG. 2, mask 250 patterns light segment 231A into three light subsegments 251A-1, 251A-2, and 251A-3, the three subsegments forming light row 255-1; light segment 231B into three light subsegments 251B-1, 251B-2, and 251B-3, the three subsegments forming light row 255-2; and light segment 231C into three light subsegments 251C-1, 251C-2, and 251C-3, the three subsegments forming light row 255-3. Therefore, in the exemplary embodiment shown in FIG. 2, n is equal to 3. Each discrete light subsegment can have any cross section, such as a rectangular cross-section, in which case, each subsegment has a length along the y-direction and a width along the x-direction. FIG. 7 shows a cross-section of light subsegments 251A-1, 251A-2, and 251A-3 in the xy-plane. Light subsegment 251A-1 has a length $L_1$ and a width $W_1$, light subsegment 251A-2 has a length $L_2$ and a width $W_2$, and light subsegment 251A-3 has a length $L_3$ and a width $W_3$. In general, mask 250 is capable of setting the length of each discrete light subsegment at any value limited, in general, by the length of a received corresponding homogenized light segment.

Mask 250 can be any type of a mask that may be suitable for patterning an incident light. For example, mask 250 may include a shadow mask having a plurality of holes in, for example, a thin optically non-transmissive plate. Mask 250 may include diffractive elements using optical diffraction to pattern an incident light. Mask 250 may include a light valve or a Spatial Light Modulator (SLM), such as a liquid-crystal-based SLM, or a switchable mirror SLM. Mask 250 may include a digital micromirror device, or a micro-electromechanical system, such as a grating light valve. Mask 250 may include an optical mask having fixed or permanent patterns that are either substantially optically transparent or non-transmissive at a wavelength of interest. Exemplary methods that can be used to fabricate an optical mask include, photolithography, electron-beam lithography, printing, or any other method that may be used to generate a fixed pattern having optically clear and non-transmissive areas.

According to one particular embodiment of the invention, mask 250 is capable of setting the length of each discrete light subsegment at any value in a range from about 0.2 to about 2500 microns with an accuracy of about 0.1 microns or better, more preferably in a range from about 1 to about 500 microns with an accuracy of about 0.1 microns or better, even more preferably in a range from about 10 to about 300 microns with an accuracy of about 1 micron or better, and still even more preferably in a range from about 50 to about 150 microns with an accuracy of about 1 micron or better. In general, by an accuracy of $\delta$, it is meant that mask 250 is capable of setting a length of a subsegment to $L\pm\delta$ microns, where L is any length value in a given preferred range. For example, by an accuracy of 1 micron, it is meant that mask 250 is capable of setting a length of a subsegment to $L\pm1$ microns, where L is any length value in a preferred range, such as from about 10 microns to about 300 microns, or from about 50 microns to about 150 microns.

According to one embodiment of the invention, for a length $L_a$, where $L_a$ is any value in a range from about 50 microns to about 3000 microns, mask 250 is capable of being designed to set the length of each discrete light subsegment at any value in a range from about $0.9L_a$ to about $1.1L_a$ with an accuracy of about 0.1 microns or better. According to another embodiment of the invention, for a length $L_a$, where $L_a$ is any value in a range from about 5 microns to about 500 microns, mask 250 is capable of being designed to set the length of each discrete light subsegment at any value in a range from about $0.8L_a$ to about $1.2L_a$ with an accuracy of about 0.1 microns or better.

Referring back to FIG. 7, separation between light subsegments 251A-1 and 251A-2 is $d_1$, and separation between light subsegments 251A-3 and 251A-2 is $d_2$. In general, a separation between adjacent discrete light subsegments can be any value desirable in an application. According to one embodiment of the invention, mask 250 is capable of being designed to set the separation between any two adjacent discrete light subsegments at 0.1 microns or larger.

In one particular embodiment of the invention, all light subsegments have substantially the same length and are substantially equally spaced. Furthermore, the spacing between adjacent light subsegments is substantially twice as long as the length of each light subsegment.

Referring back to FIG. 2, lens system 260 projects mask patterned light beam 255 onto substrate 270. As such, lens system 260 projects each light row of n discrete light subsegments (such as light row 255-1) onto substrate 270.

Furthermore, lens system 260 projects each of light rows 255-1, 255-2, and 255-3 onto substrate 270 such that the corresponding subsegments from each row (that is, subsegments forming a column in patterned light beam 255) substantially coincide on substrate 270. For example, lens system 260 projects light subsegments 251A-1, 251B-1, and 251C-1 onto substrate 270 so as to form a single projected light segment 270A. Similarly, lens system 260 projects light subsegments 251A-2, 251B-2, and 251C-2 onto substrate 270 so as to form a single projected light segment 270B. As yet another example, lens system 260 projects light subsegments 251A-3, 251B-3, and 251C-3 onto substrate 270 so as to form a single projected light segment 270C. Therefore, lens system 260 forms a single row of n discrete projected light segments along the y-direction on substrate 270.

In a preferred embodiment of the invention, the distance between the first and the nth, that is, the last discrete projected light segments, is at least 5 millimeters, more preferably at least 10 millimeters, even more preferably at least 15 millimeters, and still even more preferably at least 20 mm.

According to one embodiment of the invention, mask patterned light beam 255 includes a two-dimensional array of discrete light subsegments, where the array has n columns and m rows. The m rows are divided into p groups, each group including at least two rows of discrete light subsegments, where no row is included in more than one group. Furthermore, lens system 260 projects the m by n array of discrete light subsegments onto substrate 270 by superposing all the rows in each group so as to form an array of projected light segments, where the array has n columns and p rows. In the case where p is 1, all the m rows in patterned light beam 255 are superposed forming a row of n projected light segments.

Such an array of projected light segments can be used to, for example, transfer a same-size array of a transferable material from a carrier onto substrate 270. Hence, the present invention can be used to simultaneously pattern an array of pixels in a display component. Furthermore, the array of projected light segments can be used to pattern the pixels in an entire display component by, for example, using a step-and-repeat process.

Figure 8:
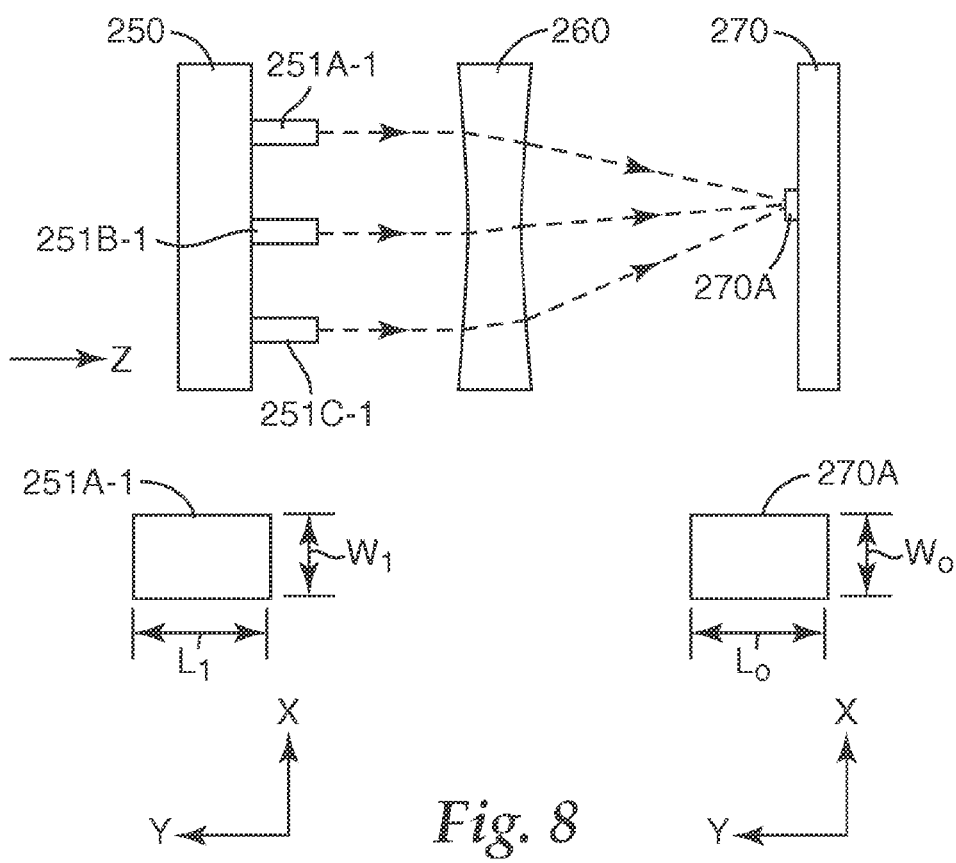
FIG. 8 illustrates a schematic side-view of superposition of light patterned by a mask in accordance with one embodiment of the invention.

The superposition or overlap of corresponding subsegments projected onto substrate 270 is further described in reference to FIG. 8 which shows a schematic side-view of a portion of imaging system 200 from FIG. 2. In particular, FIG. 8 shows mask 250, lens system 260, and substrate 270. FIG. 8 further shows light subsegments 251A-1, 251B-1, and 251C-1 as output of mask 250 and propagating along the z-direction. FIG. 8 further shows projected light segment 270A onto substrate 270. According to one particular embodiment of the invention, lens system 260 projects, relays, or transfers light subsegments 251A-1, 251B-1, and 251C-1 onto substrate 270 in such a way that the transferred light subsegments coincide on substrate 270, thereby forming a single projected light segment 270A.

An advantage of superposition of corresponding light subsegments onto substrate 270 is increased light intensity for each projected light segment. As a result, each projected light segment, such as segment 270A, can be capable of inducing a transfer of a transferable material in a shorter amount of time, thereby increasing overall throughput.

In the invention, projection of light from a first plane to a second plane refers to a transfer of light from the first plane to the second plane. As such, the second plane need not lie in an image plane of the first plane. In particular, referring to FIG. 2, exit surface 252 of mask 250 and front surface 271 of substrate 270 do not, in general, form an object-image relation relative to lens system 260. In other words, lens system 260 need not necessarily image surface 252 onto surface 271.

In one particular embodiment of the invention, lens system 260 images surface 252 onto surface 271 along the y-direction, but not along the x-direction. As such, while lens system 260 projects output light from mask 250 (that is, patterned light beam 255) onto substrate 270 along both the x- and y-directions, the lens system images the output light onto substrate 270 along the y-direction, but not along the x-direction. Therefore, lens system 260 can have a magnification factor as between mask 250 and substrate 270 along the y-axis, and a projection scale factor between the two along the x-axis. Referring back to FIG. 8, light subsegment 251A-1 has a length $L_1$ along the y-axis and a height $W_1$ along the x-axis. Similarly, projected light segment 270A has a length $L_o$ along the y-axis and a height $W_o$ along the x-axis. As such, lens system 260 has a magnification factor of $L_o/L_1$ and a projection scale factor of $W_o/W_1$.

According to a preferred embodiment of the invention, the magnification factor of lens system 260 as between mask 250 and substrate 270 is less than 5, more preferably less than 3, and even more preferably less than 2. In another preferred embodiment of the invention, the magnification factor is in a range from about 0.8 to about 1.2, more preferably in a range from about 0.9 to about 1.1, and even more preferably in a range from about 0.95 to about 1.05. In still another preferred embodiment of the invention, the magnification factor is substantially equal to one.

Furthermore, the projection scale factor of lens system 260 as between mask 250 and substrate 270 is preferably in a range from about 0.02 to about 1, more preferably in a range from about 0.04 to about 0.2, even more preferably in a range from about 0.05 to about 0.2, and even more preferably in a range from about 0.06 to about 0.1.

In a preferred embodiment of the invention, lens system 260 is an anamorphic lens system having a magnification factor of about 1 along the y-axis and a projection scale factor in a range from about 0.06 to about 0.1.

Referring back to FIG. 8, a projected light segment, such as light segment 270A, can have any intensity profile along x- and y-directions. Furthermore light segment 270A can have different intensity profiles along different directions. According to one embodiment of the invention, a projected light segment has a substantially uniform intensity profile, or a flat-top intensity profile, along the y-axis, and a Gaussian intensity profile along the x-axis. According to another embodiment of the invention, a projected light segment has a substantially uniform intensity profile along both the x- and y-directions.

According to the present invention, when a donor film that includes a transferable material coated on a carrier, is placed in contact or near contact with substrate 270 between lens system 260 and substrate 270, each of the n discrete projected light segments (such as segments 270A, 270B, and 270C in FIG. 2) is capable of inducing a transfer of the transferable material from the carrier onto substrate 270. Such a transfer of material is further described in reference to FIGS. 9 and 10.

Figure 9:
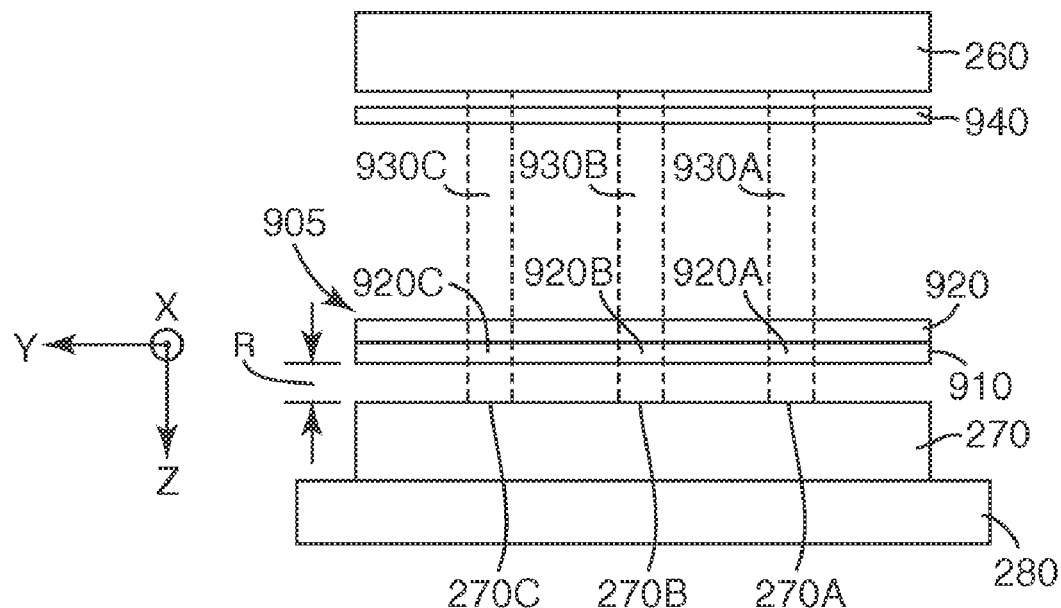
FIG. 9 illustrates a schematic side-view of transferring a transferable material in accordance with one embodiment of the invention.

FIG. 9 shows a schematic side-view of a portion of an imaging system according to the present invention illustrating an example of a transfer of a transferable material from a donor film onto a substrate. In particular, FIG. 9 shows substrate 270 placed on an optional stage 280, where stage 280 can be capable of being moved, in a predetermined way, along one or more directions, such as x-, y-, and z-directions, where the x-direction in FIG. 9 is perpendicular to the plane of the page as denoted by a circle with a dot at its center. FIG. 9 further shows a transfer film 905 that includes a donor film 910 coated on a carrier 920 with the donor film facing substrate 270. Donor film 910 includes a transferable material. Examples of transferable materials and donor films including same have previously been described in, for example, U.S. Pat. Nos. 5,747,217; 5,935,758; 6,114,088; 6,194,119; 5,521,035; 5,766,827; 5,308,737; 5,725,989; and 5,998,085.

Figure 10:
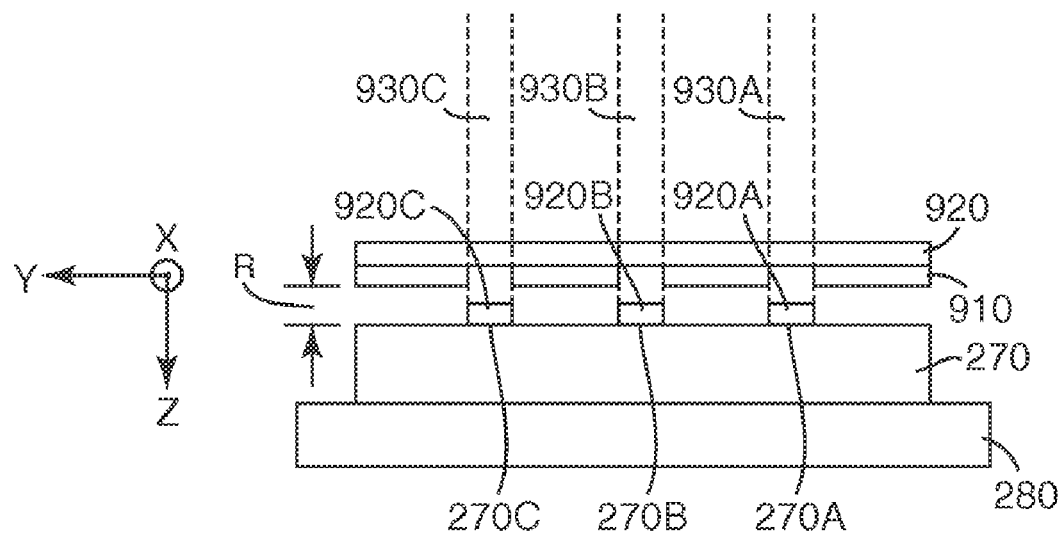
FIG. 10 illustrates a schematic side-view of a transferred transferable material in accordance with one embodiment of the invention.

FIG. 9 shows a gap "R" between donor film 910 and substrate 270. In general, R can be quite small, in which case, donor film 910 can be in contact or close to contact with substrate 270. R can be made small by, for example, applying pressure to the top side of carrier 920. As another example, gap R can be reduced by applying a vacuum to the gap area. FIG. 9 further shows projected light segments 270A, 270B, and 270C on substrate 270. These projected light segments are formed on substrate 270 by lens system 260. Beam trajectories 930A, 930B, and 930C show exemplary light projection paths from lens system 260 to projected light segments 270A, 270B, and 270C, respectively. Each projected light segment is capable of transferring donor film 910 at an area of film 910 that is illuminated by the projected light segment. For example, projected light segment 270B is capable of transferring portion 920B of donor film 910, where portion 920B corresponds to a portion of donor film 910 illuminated by projected light segment 270B. Similarly, projected light segments 270A and 270C are capable of transferring portions 920A and 920C of donor film 920, respectively. A result of such a transfer is schematically shown in FIG. 10 where portions 920A, 920B, and 920C of donor film 910 have been transferred from carrier 920 onto substrate 270. In general, a transferred portion of donor film 920 may or may not have the same shape or size as a corresponding illuminated portion of the film. In one embodiment of the invention, the size of a transferred area is within 30%, more preferably within 20%, even more preferably within 10% of the size of a corresponding illuminated area of donor film 910. In another embodiment of the invention, the size and shape of a transferred portion of donor film 920 are substantially the same as those of the corresponding illuminated area.

Transfer film 905 may include additional layers or films not shown in FIG. 9, such as a light-to-heat conversion film. Examples of various layers that may be included in transfer film 905 have been previously disclosed, for example, in U.S. Pat. Nos. 5,521,035; 6,114,088; 5,725,989; 6,194,119; and 5,695,907.

Referring back to FIG. 2, a shutter may be disposed at one or more locations along the beam path from light source 210 to substrate 270 to turn "on" or "off" the projected lights segments on substrate 270. An example of one such shutter is schematically shown in FIG. 9, where a shutter 940 is placed between lens system 260 and substrate 270. As such, when shutter 940 is open, projected light segments 270A, 270B, and 270C are formed on substrate 270 and are capable of transferring portions of donor film 910. Similarly, when shutter 940 is closed, no light can reach substrate 270 and, thus, there is no induced transfer of donor film 910. Where stage 280 is moved along a particular path in the xy-plane, a projected light segment, such as projected light segment 270A, can induce a transfer in a shape or form that closely follows the path taken by stage 280. For example, if stage 280 is moved along x-axis while projected light segments 270A, 270B, and 270C are all on, then the projected light segments can transfer donor film 910 onto substrate 270 in a form of three lines along the x-axis. On the other hand, if, for example, stage 280 is stationary, then the transferred areas can correspond closely to the size of the projected light segments. Accordingly, an imaging system according to one embodiment of the invention can be used to transfer a transferable material in a pre-determined form such as discrete pixels corresponding to pixels in a display, or parallel lines, for example, covering corresponding columns in a display, or any other shape or form that may be desirable when patterning a display component in a particular application.

Total light output power of light source 250 is preferably sufficiently high so that projected light segments 270A, 270B, and 270C are capable of inducing a transfer of a transferable material from a donor film to substrate 270. In one embodiment of the invention total output power of light source 250 is at least 200 watts, more preferably at least 400 watts, even more preferably at least 600 watts, even more preferably at least 800 watts, and still even more preferably at least 900 watts. Furthermore, light output of light source 250 may be pulsed or continuous.

In one embodiment of the invention, total light power delivered to substrate 270 is at least 50 watts, more preferably at least 100 watts, even more preferably at least 150 watts, and even more preferably at least 200 watts.

Referring back to FIG. 2, according to one embodiment of the invention, mask 250 is capable of patterning each homogenized light segment (such as segment 231A) into a row of discrete light subsegments (such as subsegments 251A-1, 251A-2, and 251A-3), where the length of each subsegment can be set with a high degree of accuracy. A few exemplary embodiments of mask 250 are now described.

Figure 11:
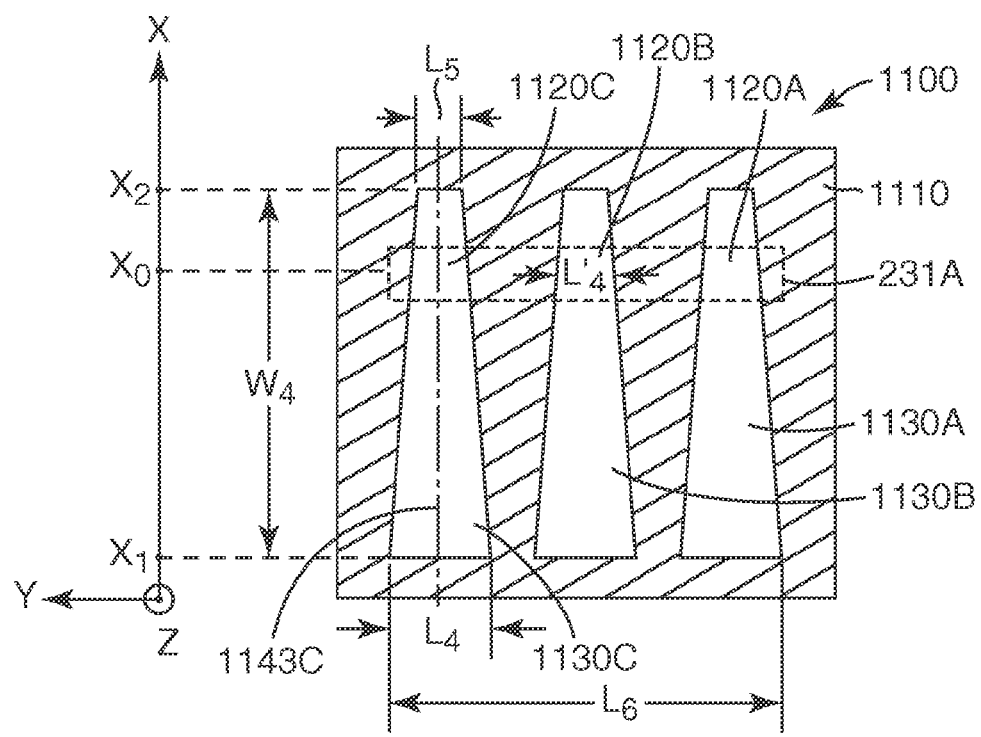
FIG. 11 illustrates a schematic top-view of a mask in accordance with one embodiment of the invention.

FIG. 11 illustrates a schematic top-view of a mask 1100 as a particular embodiment of mask 250. Mask 1100 includes multiple optically transmissive areas or parts in an otherwise optically non-transmissive region. In particular, exemplary mask 1100 has three optically transmissive areas 1130A, 1130B, and 1130C surrounded by optically non-transmissive area 1110. According to one aspect of the invention, each transmissive part is centered along an axis. For example, optically transmissive part 1130C is centered on axis 1143C. Furthermore, according to one embodiment of the invention, axis 1143C is oriented along the x-axis.

By optically non-transmissive it is meant that any light that may be transmitted by area 1110 has a sufficiently low light power or intensity as to be incapable of inducing a transfer of a transferable material from a donor film onto substrate 270. In one embodiment of the invention, total optical transmission of areas 1110 is preferably less than 30%, more preferably less than 20%, even more preferably less than 10%, and even more preferably less than 5%. Area 1110 can be optically non-transmissive by being optically reflective, absorptive, diffractive, or a combination thereof. Area 1110 can be optically reflective by, for example, including a reflective metal coating. Exemplary metal materials that can be used in a reflective metal coating include silver, gold, chromium, aluminum, copper, or a combination thereof, or any other suitable reflective metal material. Generally, all metals have some residual optical absorption. As such, a high intensity light incident on mask 1100 can generate a substantial amount of heat in the reflective metal layer, and therefore, in mask 1100. The generated heat can not only damage the metal coating, but it can also cause thermal expansion, even non-uniform thermal expansion, in the mask, thereby introducing significant changes in the intended dimensions of various features in the mask.

As another example, area 1110 can be optically reflective by including a multilayer dielectric coating that reflects light at a wavelength of interest by optical interference. In such a case, one or more layers in the multilayer dielectric coating can, for example, be quarter wave thick at the wavelength of interest.

As another example, area 1110 can be optically reflective by including a reflective multilayer dielectric coating disposed on a reflective metal layer. In this example, the multilayer dielectric coating can reflect a significant portion of an incident light with essentially no or very little optical absorption. Any residual light that may be transmitted by the multilayer dielectric coating is reflected by the metal layer. An advantage of such a construction is that the metal is not directly exposed to high intensity incident light that can cause damage to or generate an unacceptable amount of heat in the metal layer.

Area 1110 may be designed so that any light that may be reflected by this area is reflected in an off-axis direction, that is, in a direction sufficiently different from the light incidence direction so as to avoid other elements in imaging system 200.

For simplicity and without loss of generality, it is assumed that the three optically clear or transmissive areas 1130A, 1130B, and 1130C have the same shape and dimensions. In particular, each of the clear areas is a trapezoid having a length $L_4$ for the lower base (corresponding to a location $X_1$ along the x-axis), a length $L_5$ for the upper base (corresponding to a location $X_2$ along the x-axis), and a height $W_4$ (corresponding to the distance between $X_1$ and $X_2$). FIG. 11 also shows homogenized light segment 231A (from FIG. 2) incident on mask 1100 at location $X_o$ along the x-axis. It can be appreciated that mask 1100 patterns homogenized light segment 231A into three light subsegments 251A-1, 251A-2, and 251A-3 corresponding to clear areas 1120A, 1120B, and 1120C, respectively, where the length of each subsegment (see FIG. 7) is $L'_4$, the length of each trapezoid at $X_o$, the location of light incidence. A key characteristic of mask 1100 according to one particular embodiment of the invention, is that the length of each light subsegment (such as subsegment 251A-1) can essentially be set at any value in a range from about $L_4$ to about $L_5$ by choosing an appropriate location along the x-axis.

Mask 1100 can be made using any or a combination of commercially available patterning methods or any patterning technique that may be suitable in making the mask. Exemplary patterning methods include photolithography, ink jet printing, laser ablation, photo-bleaching, electron-beam lithography, machining, ion milling, reactive ion etching, or the like. One or more of said exemplary patterning methods is capable of patterning masks as large as, for example, 25 cm by 25 cm over essentially the entire area of the mask with features smaller than one micron and larger than, for example, 100 microns with a dimensional accuracy of 1 micron or even 0.1 microns or better.

Referring back to FIG. 11, an "active area" can be defined for mask 1100, where the active area is defined by a smallest outer perimeter that includes all the optically clear features in the mask that are used to pattern an incident beam. For example, for mask 1100 a rectangular active area can be defined with a length $L_6$ along the y-axis and a width $W_4$ along the x-axis. Dimensions $W_4$ and $L_6$ can assume any value according to a particular application in which mask 1100 is used. In particular, according to the present invention, the active area of mask 1100 can cover any area in arrange from about 5 mm by 5 mm to about 40 cm by 40 cm.

Figure 12:
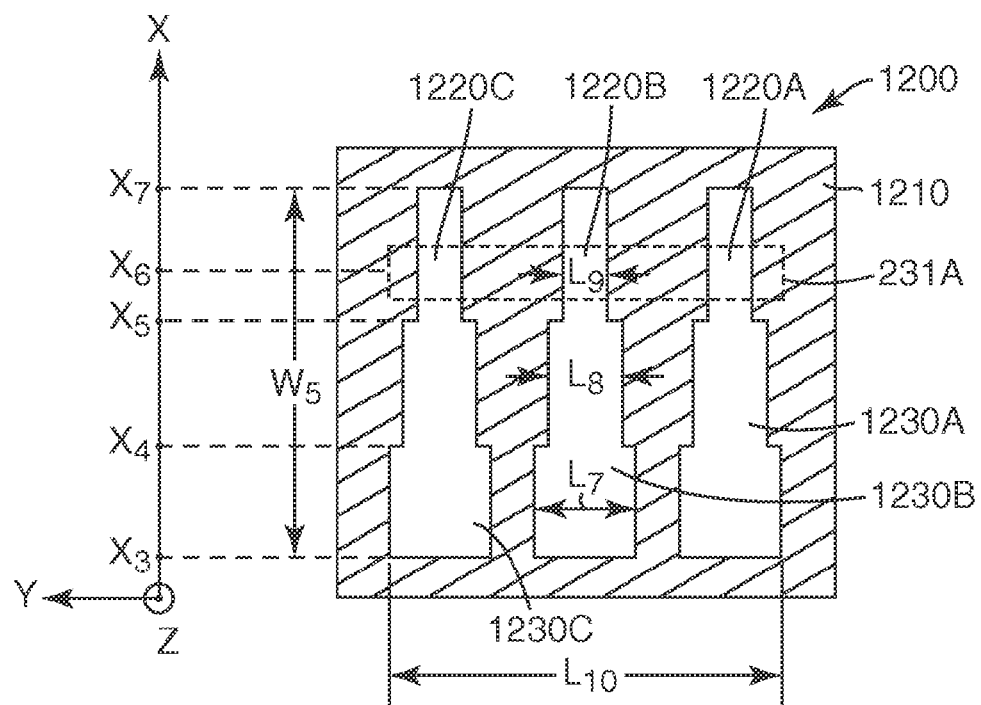
FIG. 12 illustrates a schematic top-view of a mask in accordance with one embodiment of the invention.

FIG. 11 shows a mask pattern where the length (the dimension along the y-axis) of each clear aperture (such as area 1130C) essentially varies continuously between $L_4$ and $L_5$. FIG. 12 illustrates a schematic top-view of a mask 1200 as another embodiment of mask 250, where the length of each clear aperture changes in discrete steps at several points along the x-axis. Similar to mask 1100, mask 1200 includes three optically transmissive areas 1230A, 1230B, and 1230C surrounded by optically non-transmissive area 1210, where area 1210 can be made optically non-transmissive similar to area 1110 in mask 1100.

Similar to mask 1100, for simplicity and without loss of generality, it is assumed that the three optically clear areas 1230A, 1230B, and 1230C have the same shape and dimensions. In particular, each of the clear areas includes three segments, each segment having a constant length. For example, optically transmissive area 1230C has a bottom clear segment having a constant length $L_7$, a middle clear segment having a constant length $L_8$, and a top clear segment having a constant length $L_9$. As such, the length of optically clear area 1230C makes a step change at $X_4$ and another step change at $X_5$. Furthermore, optically transmissive area 1230C has a height $W_5$ which is the distance between coordinates $X_3$ and $X_7$. FIG. 12 also shows homogenized light segment 231A incident on mask 1200 at location $X_6$ along the x-axis. Therefore, in the example of FIG. 12, mask 1200 patterns homogenized light segment 231A into three light subsegments 251A-1, 251A-2, and 251A-3 corresponding to clear areas 1220A, 1220B, and 1220C, respectively, where the length of each subsegment is $L_9$. An advantage of mask 1200 is that a small change in location of incident light (that is, a small change in $X_6$) does not affect the length of each patterned light subsegment. At the same time, the length of each light subsegment can be one of a discrete number of values, in this case, one of three values $L_7$, $L_8$, and $L_9$ by, for example, moving one or both of an incident light and mask 1200.

Similar to mask 1100, a rectangular "active area" can be defined for mask 1200 having a length $L_{10}$ along the y-axis and a width $W_5$ along the x-axis.

Figure 13:
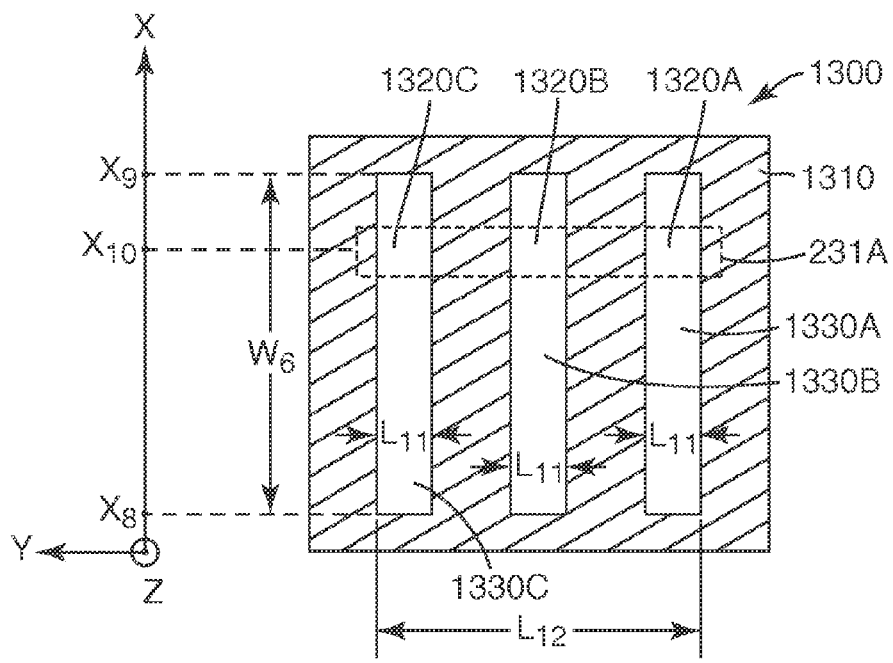
FIG. 13 illustrates a schematic top-view of a mask in accordance with one embodiment of the invention.

FIG. 13 illustrates a schematic top-view of a mask 1300 as another embodiment of mask 250, where the length of each clear aperture is a constant along the x-axis. Similar to mask 1100, mask 1300 includes multiple, such as three optically transmissive areas 1330A, 1330B, and 1330C surrounded by optically non-transmissive area 1310, where area 1310 can be made optically non-transmissive similar to area 1110 in mask 1100.

Similar to mask 1100, for simplicity and without loss of generality, it is assumed that the three optically clear areas 1330A, 1330B, and 1330C have the same shape and dimensions. In particular, each of the clear areas has a rectangular shape having a constant length $L_{11}$ and a height $W_6$. Homogenized light segment 231A incident on mask 1300 at any location $X_{10}$ between locations $X_8$ and $X_9$ results in a patterning of the homogenized light segment into three light subsegments 251A-1, 251A-2, and 251A-3 corresponding to clear areas 1320A, 1320B, and 1320C, respectively, where the length of each subsegment is $L_{11}$. An advantage of mask 1300 is that even a large change in location of incident light (that is, a large change in $X_{10}$) does not affect $L_{11}$, the length of each patterned light subsegment.

Similar to mask 1100, a rectangular "active area" can be defined for mask 1300 having a length $L_{12}$ along the y-axis and a height $W_6$ along the x-axis.

In each of the exemplary embodiments of mask 250 described in FIGS. 11 through 13, the embodiment includes three distinct optically clear areas, thereby each embodiment is capable of patterning an incident homogenized light segment into three light subsegments. According to the present invention, M, the number of distinct optically clear areas in mask 250 is preferably greater than 10, more preferably greater than 20, even more preferably greater than 30, and even more preferably greater than 50.

Total optical transmittance (at a wavelength of interest), and in particular, specular optical transmittance (again, at a wavelength of interest) of an optically transmissive area, such as, for example, area 1130A in FIG. 11, area 1230B in FIG. 12, and area 1320C in FIG. 13, is quite uniform within the entire region of the optically clear area. According to one aspect of the invention, uniformity of total optical transmittance within the entire region of an optically transmissive area of a mask according to any embodiment of the invention is 1% or better, more preferably $10^{-2}$% or better, even more preferably $10^{-3}$% or better, even more preferably $10^{-4}$% or better, and still even more preferably $10^{-5}$% or better, where by an optical uniformity of, for example, $10^{-4}$% or better it is meant that the percent difference between total optical transmittance at any two points within an optically transmissive area is $10^{-4}$ or less.

Furthermore, an internal optical transmittance may be defined for any location within an optically transmissive area of a mask as the total optical transmittance (at a wavelength of interest) excluding all interfacial (or Fresnel) reflection losses, if any. The internal optical transmittance of a mask, according to any embodiment of the invention, at any point within an optically transmissive area of the mask is at least 99%, more preferably at least 99.9%, even more preferably at least 99.99% and even more preferably at least 99.999%.

In one embodiment of the invention, mask 250 is capable of patterning an incident light beam with great efficiency, meaning with no or little overall optical loss. As such, mask 250 can be capable of patterning an incident light beam without rejecting a substantial portion of the incident light. For example, imaging system 200 can include a light recycling mechanism in order to pattern an incident light while maintaining high overall optical transmission. As another example, imaging system 200 can include an optical apparatus for directing most or essentially all of an incident light to the optically transmissive parts of mask 250. For example, an array of microlenses, such as cylindrical microlenses, can be used to direct an incident light to different optically transmissive parts of mask 250. An example of an optical apparatus for redirecting an incident light to clear parts of mask 250 may be found in U.S. Pat. No. 6,366,339.

According to one embodiment of the invention, imaging system 200 has high overall optical transmission, where overall optical transmission refers to the ratio of the total amount of light delivered to substrate 270 to the total light output of light source 210. According to one embodiment of the invention, the overall optical transmission of imaging system 200 is at least 20%, more preferably at least 30%, more preferably at least 40%, and even more preferably at least 50%. According to another embodiment of the invention, the overall optical transmission of imaging system 200 is at least 70% and more preferably at least 80%.

Figure 14:
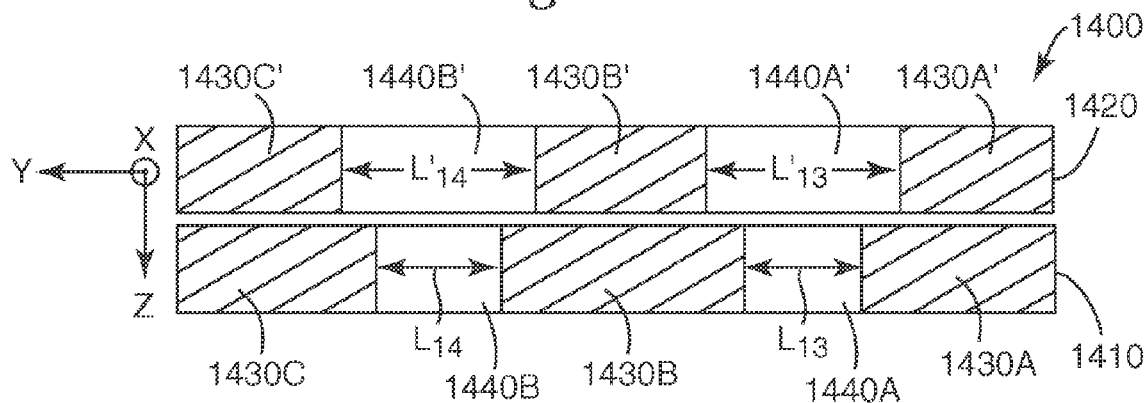
FIG. 14 illustrates a schematic side-view of a mask having a pre-mask in accordance with one embodiment of the invention.

A mask according to any embodiment of the present invention may include a main mask and one or more pre-masks, where the pre-masks can be primarily designed to protect the optically non-transmissive areas of the main mask from damage that can be caused, for example, by a high intensity incident light beam. Furthermore, each optically transmissive area in the main mask has a corresponding optically transmissive areas in the one or more pre-masks. In addition, the opening or the optical aperture provided by an optically transmissive area in a pre-mask is larger than the opening or the optical aperture provided by the corresponding optically transmissive area in the main mask. As such, a perimeter of an optically clear area in a pre-mask lies without a perimeter of a corresponding clear area in the main mask. FIG. 14 illustrates a schematic side-view of a portion of a mask 1400 according to one embodiment of the invention, where the mask includes a pre-mask. In particular, optical mask 1400 includes a main mask 1410 and a pre-mask 1420 disposed proximate main mask 1410. Main mask 1410 includes optically non-transmissive areas 1430A, 1430B, and 1430C, and optically transmissive areas 1440A and 1440B. Similarly, pre-mask 1420 includes optically non-transmissive areas 1430A', 1430B', and 1430C', and optically transmissive areas 1440A' and 1440B'. Optically transmissive areas 1440A and 1440B have lengths $L_{13}$ and $L_{14}$, respectively. Similarly, optically transmissive areas 1440A' and 1440B' have lengths $L'_{13}$ and $L'_{14}$, respectively. It can be seen from FIG. 14 that $L'_{13}$ is larger than $L_{13}$ and $L'_{14}$ is larger than $L_{14}$. As such, the optical aperture provided by, for example, clear area 1440A' is larger than the optical aperture provided by the corresponding clear area 1440A. An advantage of pre-mask 1420 having larger optically clear areas than their corresponding optically clear areas in the main mask is ease of alignment between the pre-mask and main mask. A further advantage is that an inadvertent small move by the mask or the pre-mask, or any thermal expansion in pre-mask 1420, does not change the linewidth of a light subsegment (such as light subsegment 251A-1 in FIG. 2).

Figure 15:
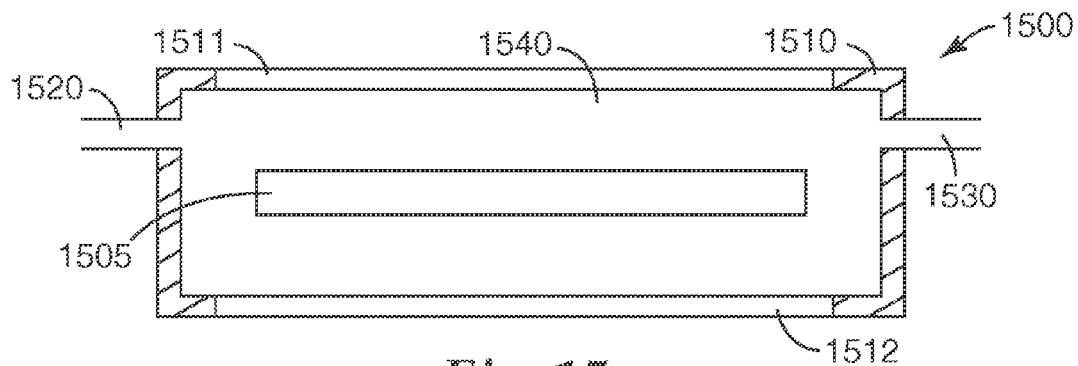
FIG. 15 illustrates a schematic side-view of a mask assembly in accordance with one embodiment of the invention.

Referring back to FIG. 11, the intensity of incident homogenized light segment 231A may be sufficiently high that a residual optical absorption in the optically non-transmissive area 1110 (and to a lesser extent, in the optically transmissive areas) may cause mask 1100 to thermally expand. A thermal expansion in the mask may cause dimensions of the features in the mask, such as length $L'_4$, to change beyond an acceptable value, for example, because the expansion would cause an unacceptable misregistration between projected light segments (for example, light segments 270A, 270B, and 270C in FIG. 2) and a display component that is being patterned. Providing one or more pre-masks can mitigate the undesirable effects of thermal expansion in the main mask. An alternative or additional approach is to provide a cooling mechanism for the mask to compensate for undesirable thermal effects caused by, for example, residual light absorption. Cooling can be provided for example, by passing a stream of cool air over the mask. Another example is illustrated in FIG. 15 showing a schematic side-view of a mask assembly 1500 which includes a mask 1505 enclosed in a cooling chamber 1510. Cooling chamber 1510 contains a coolant 1540 for removing heat generated in mask 1505. Cooling chamber 1510 has optional inlet 1520 and outlet 1530 for letting coolant 1540 in and out of cooling chamber 1510. The cooling mechanism displayed in FIG. 15 may be part of an open- or closed-loop cooling system. Coolant 1540 may be a gas, such as air, or chemically inert gases such as argon or nitrogen. Coolant 1540 may be a liquid, such as water, or a modified water solution. Cooling chamber 1510 further includes optically transmissive input window 1511 and output window 1512 for providing passage for an incident light beam.

In some applications, it may be desirable or necessary to maintain at least some components or portions of an imaging system of the invention at a relatively constant temperature. In some applications, it may be desirable or necessary to maintain the entire imaging system including all the optical elements and mounts that hold the elements in place, at a relatively constant temperature. A relatively constant temperature may be required, for example, to maintain accurate registration during patterning a display component. As such, elements not directly a part of the imaging system, such the display component or donor films may need to be maintained at a constant temperature also. Maintaining a constant overall temperature may be achieved, for example, by providing a dedicated temperature control system for each element or sub-assembly of the imaging system. The temperature may further be maintained at a relatively constant value by placing the entire imaging system in a temperature controlled housing such as a temperature controlled room.

Figure 16:
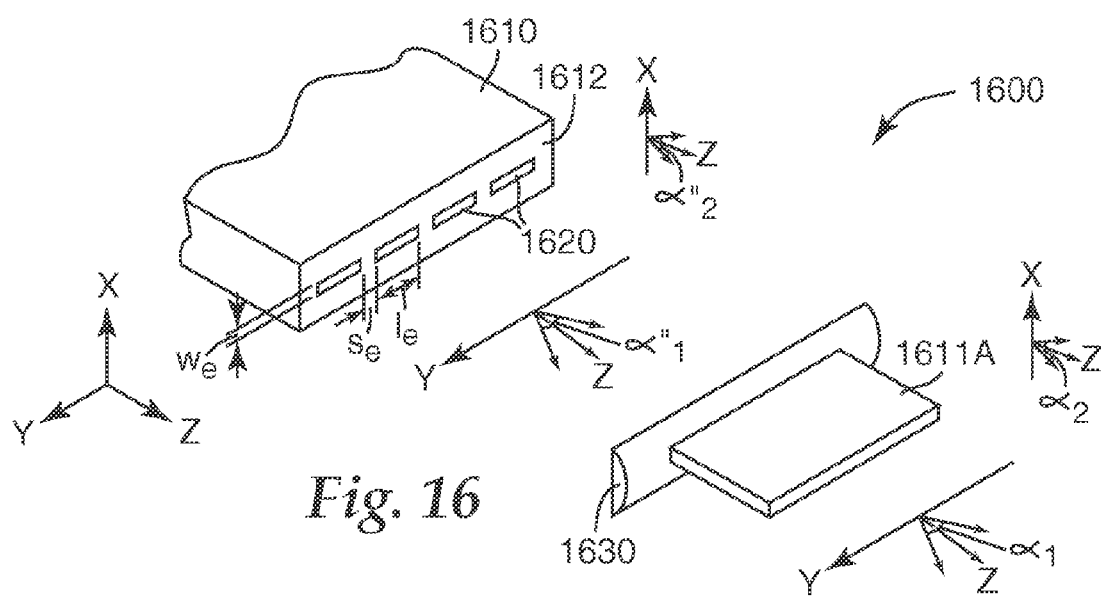
FIG. 16 illustrates a schematic three-dimensional view of a light bar assembly in accordance with one embodiment of the invention.

Referring back to FIG. 2, light source 210 is capable of emitting a patterned light beam 215. In what follows different embodiments of light source 210 are discussed in some detail. FIG. 16 illustrates a schematic three-dimensional view of a light bar assembly 1600 in accordance to one particular embodiment of the invention. In one embodiment of the invention, light source 250 includes one or more light bar assemblies 1600. Light bar assembly 1600 includes a light bar 1610 and a collimating lens assembly 1630. Light bar 1610 includes a plurality of discrete light emitters 1620. For example, FIG. 16 shows four such light emitters.

Light emitters 1620 are capable of emitting light at one or more discrete wavelengths of interest, one or more continuous ranges of wavelength, or a combination thereof. Furthermore, light emitters 1620 may emit light in any range of the electromagnetic spectrum, such as the ultraviolet range, the near ultraviolet range, the visible range, the near infrared range, or the infrared range, or any combination thereof. In one particular embodiment of the invention, each light emitter 1620 emits light at one or more wavelengths in a range from about 700 nanometers to about 1700 nm, more preferably in a range from about 750 nanometers to about 1200 nm, even more preferably in a range from about 750 nanometers to about 900 nm, even more preferably in a range from about 770 nanometers to about 830 nm, and still even more preferably in a range from about 780 nanometers to about 820 nm.

In general, light emitters 1620 can emit light having any cross-sectional profile. For example, each of light emitters 1620 shown in FIG. 16 emit light having a rectangular profile, where the rectangular profile at the output face 1612 of light bar 1610 has a length $l_e$ along the y-axis and a height $W_e$ along the x-axis. Other exemplary profiles include a circle, an ellipse, a polygon, such as a quadrilateral, a rhombus, a parallelogram, a trapezoid, a rectangle, a square, or a triangle. Furthermore, the size and dimensions of light emitted by light emitter 1620 may vary depending on such parameters as availability, design of the overall imaging system, and the particular application of interest. In one particular embodiment of the invention, light emitter 1620 emits light preferably having a polygon profile, more preferably a quadrilateral profile, and even more preferably a rectangular profile.

Furthermore, according to one particular embodiment of the invention, light emitter 1620 emits light having a rectangular profile, where preferably $l_e$ is in a range from about 25 to about 400 microns and $w_e$ is in a range from about 0.1 to about 10 microns, more preferably $l_e$ is in a range from about 50 to about 300 microns and $w_e$ is in a range from about 0.3 to about 5 microns, and even more preferably $l_e$ is in a range from about 75 to about 225 microns and $w_e$ is in a range from about 0.5 to about 3 microns. Furthermore, $s_e$, separation between adjacent light emitters 1620, is preferably in a range from about 25 microns to about 400 microns, more preferably in a range from about 50 microns to about 300 microns, and even more preferably in a range from about 75 microns to about 225 microns.

Light emitted by light emitters 1620 and before going through collimating lens assembly 1630 has a full divergence angle $\alpha''_1$ along the y-axis and a full divergence angle $\alpha''_2$ along the x-axis, where $\alpha''_1$ can typically be in a range from about 2 degrees to about 15 degrees, and $\alpha''_2$ can typically be in a range from about 5 degrees to about 50 degrees.

For simplicity, ease of illustration, and without loss of generality, FIG. 16 shows a physical separation between collimating lens assembly 1630 and output face 1612 of light bar 1610. In most applications, however, it may be desirable that collimating lens assembly 1630 be attached, for example, by an optical adhesive, to output face 1612 of light bar 1610. In some applications, an optically transmissive material such as an index matching material may be fill the gap between collimating lens assembly 1630 and light bar 1610, for example, to reduce reflection losses.

Collimating lens assembly 1630 may be designed to reduce divergence angles $\alpha''_1$ and $\alpha''_2$. In one embodiment of the invention, collimating lens assembly 1630 substantially reduces divergence angle $\alpha''_2$ without significantly affecting $\alpha''_1$. As such, collimating lens assembly 1630 can act like a cylindrical lens, although it may include multiple lenses, with its direction of optical power oriented along the x-axis as shown in FIG. 16. According to this embodiment of the invention, collimating lens assembly 1630 substantially collimates output light of each light emitter 1620 along the x-direction. Light emitted by each light emitter 1620 and transmitted by collimating lens assembly has a full divergence angle $\alpha_2$ along the x-axis and full divergence angle $\alpha_1$ along the y-axis, where $\alpha_1$ can be substantially the same as $\alpha''_1$. $\alpha_2$ is preferably not greater than 1 degree, more preferably not greater than 0.5 degrees, even more preferably not greater than 0.1 degrees, and even more preferably not greater than 0.05 degrees, and still even more preferably not greater than 0.03 degrees.

According to one aspect of the invention, a relatively large $\alpha''_1$ (for example, where $\alpha''_1$ is at least 30 degrees) combined with a relatively small $s_e$ (for example, where $s_e$ is no greater than 225 microns), allow light emitted from light emitters 1620 to partially mix and overlap in the yz-plane (along the y-axis) so that emitted light segment 1611A, light output of collimated lens assembly 1630, appears to have a continuous profile in the xy-plane. In particular, emitted light segment 1611A has a uniformity profile along the y-axis which is similar to profile 211A-y shown in FIG. 4A and a uniformity profile along the x-axis which is similar to profile 211A-x shown in FIG. 4B. Emitted light segment 1611A can be one of the emitted light segments shown in FIG. 2, such as emitted light segment 211A.

Figure 17:
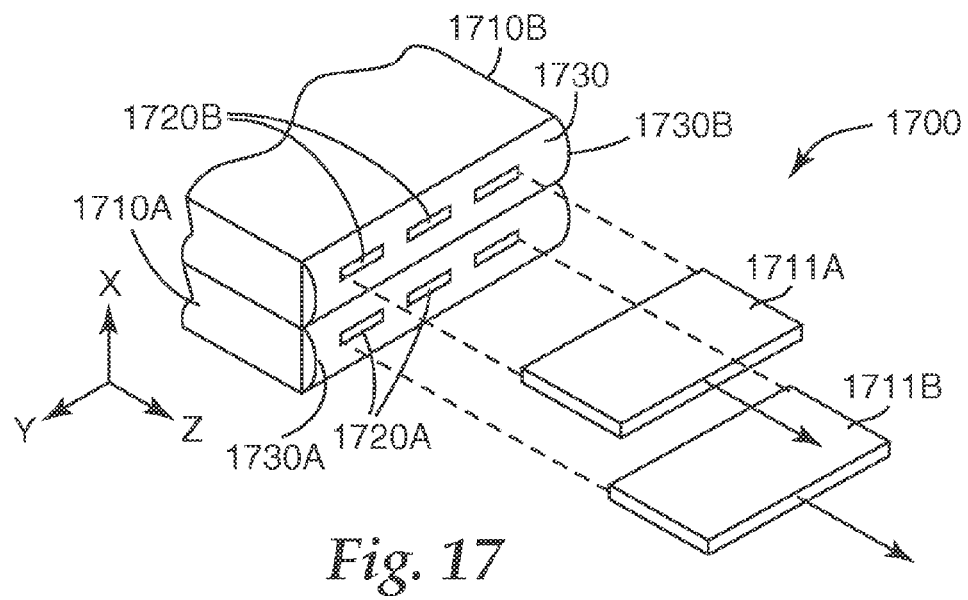
FIG. 17 illustrates a schematic three-dimensional view of a light bar assembly in accordance with one embodiment of the invention.

A light bar assembly may include more than one light bar 1610, such as a light bar assembly shown in FIG. 17. FIG. 17 illustrates a schematic three-dimensional view of a light bar assembly 1700 in accordance with another embodiment of the invention. Light bar assembly 1700 includes a stack of two discrete light bars 1710A and 1710B. Each of light bars 1710A and 1710B includes a plurality of light emitters 1720A and 1720B, respectively. For example, FIG. 17 shows three light emitters in each light bar. Light bar assembly 1700 further includes a collimating lens assembly 1730. In general, each light bar requires its own dedicated collimating lens system to provide light collimation in one or more directions. As such, collimating lens assembly 1730 includes two collimating lens subassemblies 1730A and 1730B, one subassembly for each light bar. According to one aspect of the invention, each lens subassembly substantially collimates light emitted by its corresponding light bar in the x-direction but not in the y-direction. Collimating lens subassemblies 1730A and 1730B may be separate parts forming collimating lens assembly 1730, or they may be an integral part of the lens assembly.

According to one aspect of the invention, the output of collimating lens assembly 1730 includes emitted light segments 1711A and 1711B, each having a rectangular profile and propagating along the z-axis. In particular, each of emitted light segment 1711A and 1711B has a uniformity profile along the y-axis which is similar to profile 211A-y shown in FIG. 4A and a uniformity profile along the x-axis which is similar to profile 211A-x shown in FIG. 4B. Emitted light segments 1711A and 1711B can, for example, be two of the emitted light segments shown in FIG. 2, such as emitted light segments 211A and 211B.

Figure 18:
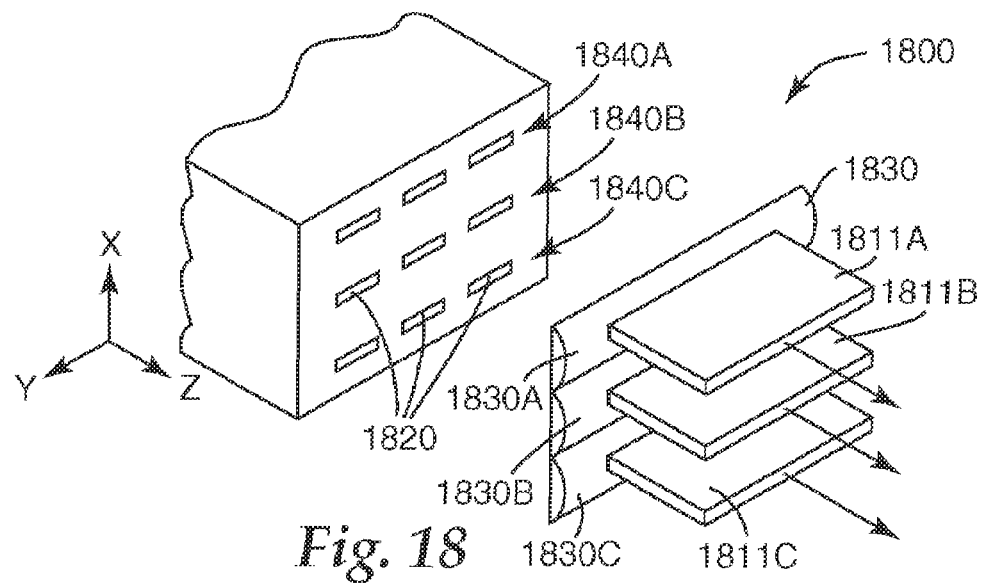
FIG. 18 illustrates a schematic three-dimensional view of a light bar assembly in accordance with one embodiment of the invention.

FIG. 17 shows a two dimensional array of light emitters by stacking two discrete light bars 1710A and 1710B, each having a one-dimensional array of light emitters (1720A and 1720B, respectively). FIG. 18, on the other hand, illustrates a light bar assembly 1800 that includes a monolithic two-dimensional array of light emitters 1820 (e.g., a three by three array as shown in FIG. 18) where light emitters 1820 can be similar to light emitters 1620. In particular, light bar assembly 1800 includes three rows 1840A, 1840B, and 1840C of light emitters 1820, each row of light emitters including three light emitters. Light bar assembly 1800 further includes a collimating lens assembly 1830 which includes three collimating lens subassemblies 1830A, 1830B, and 1830C, each primarily designed to substantially collimate output light from a corresponding row of light emitters in the x-direction but not in the y-direction.

According to one aspect of the invention, the output of collimating lens assembly 1830 includes emitted light segments 1811A, 1811B, and 1811C, each having a rectangular profile and propagating along the z-axis. In particular, each of emitted light segment 1811A, 1811B, and 1811C has a uniformity profile along the y-axis which is similar to profile 211A-y shown in FIG. 4A and a uniformity profile along the x-axis which is similar to profile 211A-x shown in FIG. 4B. Emitted light segments 1811A, 1811B, and 1811C can, for example, be the three emitted light segments 211A, 211B, and 211C shown in FIG. 2.

Figure 19:
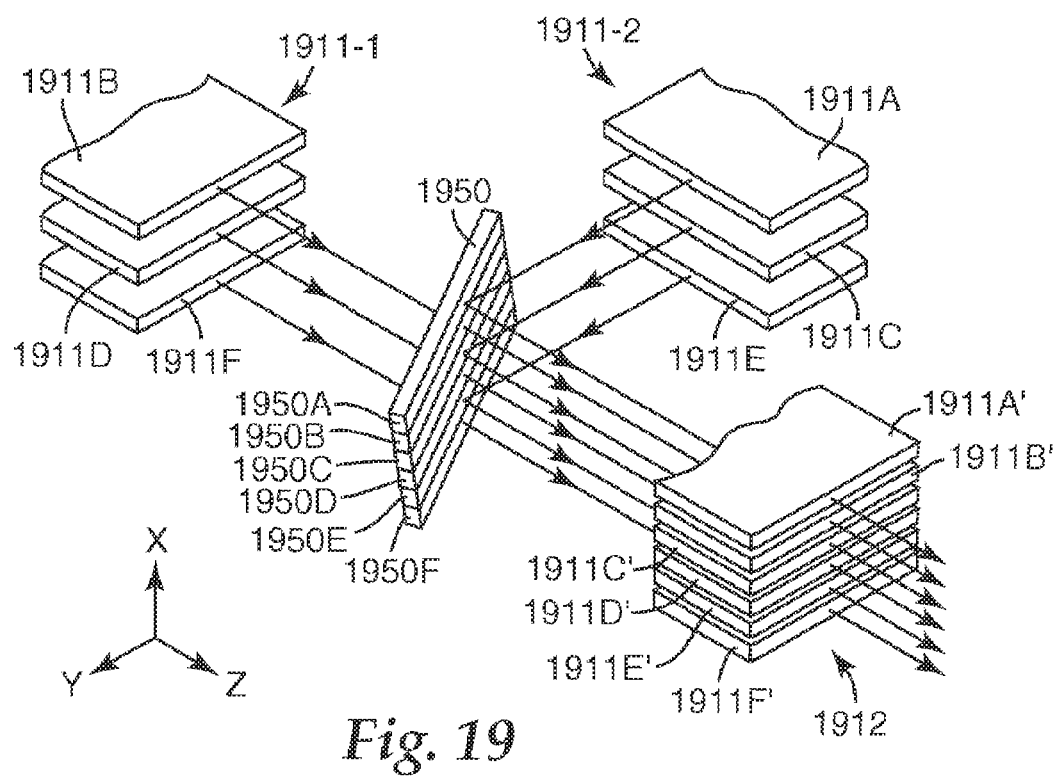
FIG. 19 illustrates a schematic three-dimensional view of a light combiner combining two sets of emitted light segments in accordance with one embodiment of the invention.

Referring back to FIG. 2, according to one embodiment of the invention, patterned light beam 215 which includes a plurality of emitted light segments, can be formed by combining two or more sets of emitted light segments, where each set can be produced by, for example, a light bar assembly such as those shown in FIGS. 16-18. FIG. 19 illustrates a schematic three-dimensional view of combining two sets of emitted light segments to form a new larger set of emitted light segments. In particular, FIG. 19 shows a first set of emitted light segments 1911-1 and a second set of emitted light segments 1911-2, where each set of emitted light segments can be the output of a light bar assembly such as those shown in FIGS. 16-18. In the exemplary embodiment shown in FIG. 19, first set of emitted light segments 1911-1 includes three emitted light segments 1911B, 1911D, and 1911F where each emitted light segment can be similar to light segment 1611A described in reference to FIG. 16. Similarly, second set of emitted light segments 1911-2 includes three emitted light segments 1911A, 1911C, and 1911E where each emitted light segment can be similar to light segment 1611A.

Figures 20A, 20B, 20C:
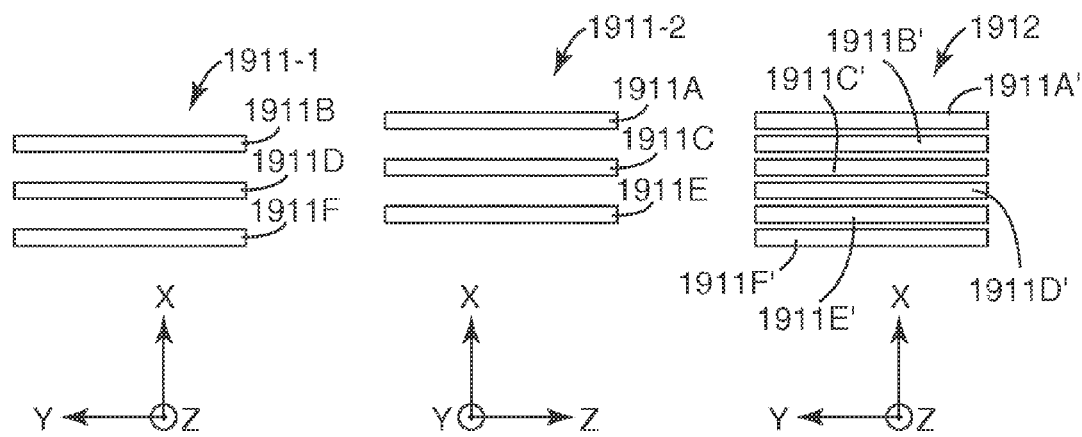
FIGS. 20A-C illustrate cross-sectional views of the two sets of emitted light segments and the resulting combination of the two sets shown in FIG. 19.

FIG. 19 further shows a light combiner 1950 having alternate areas of high specular optical transmittance and reflectance. In particular, combiner 1950 has areas 1950A, 1950C, and 1950E each having a high specular optical reflectance, and areas 1950B, 1950D, and 1950F each having a high specular optical transmittance. Beam combiner 1950 is oriented in such a way that each optically transmissive area of the beam combiner transmits a corresponding emitted light segment from the first set of light segments, and each optically reflective area of the beam combiner reflects a corresponding emitted light segment from the second set of light segments, so that the transmitted and reflected emitted light segments form a new larger set of emitted light segments propagating along a same direction without any mixing or partial overlap between the segments. For example, first set of light segments 1911-1 can be propagating along the z-direction, having a cross-sectional profile in the xy-plane as shown in FIG. 20A. Furthermore, second set of light segments 1911-2 can be propagating along the y-direction, having a cross-sectional profile in the xz-plane as shown in FIG. 20B. Light combiner 1950 can be oriented to lie in a plane normal to the yz-plane and making a 45 degree angle with the y- or z-axis. Furthermore, as can be seen from FIGS. 20A and 20B, emitted light segments of the first set are positionally offset with respect to the emitted light segments of the second set along the x-axis. Furthermore, light combiner 1950 is positioned so that emitted light segments 1911B, 1911D, and 1911F of the first set line up with transmissive areas 1950B, 1950D, and 1950F of the combiner, and emitted light segments 1911A, 1911C, and 1911E of the second set line up with reflective areas 1950A, 1950C, and 1950E of the combiner. As a result, beam combiner 1950 transmits emitted light segments 1911B, 1911D, and 1911F to form emitted light segments 1911B', 1911D', and 1911F', and reflects emitted light segments 1911A, 1911C, and 1911E to form emitted light segments 1911A', 1911C', and 1911E' so that the reflected and transmitted emitted light segments form a patterned light beam 1912 which includes emitted light segments 1911A' through 1911F' propagating along the z-direction. In one aspect of the invention there is little or no light mixing or partial overlap between the emitted light segments along the x-axis. In another aspect of the invention, there is some overlap between the emitted light segments along the x-axis. In a preferred embodiment of the invention, any over lap between emitted light segments is at most partial, meaning that the overlap is no more than about 50% between adjacent emitted light segments. Patterned light beam 1912 has a cross-sectional profile in the xy-plane as shown in FIG. 20C, and can, for example, be patterned light beam 215 shown in FIG. 2.

An advantage of combining sets of emitted light segments as shown in FIG. 19 is increased light power or intensity at substrate 270 (see FIG. 2) resulting in increased overall throughput. It can be appreciated that patterned light beam 1912 may be combined with a similar patterned light beam using a light combiner similar to light combiner 1950 to form a new patterned light beam with more emitted light segments and thus, even more light power or intensity at substrate 270. As such, the combining method described in reference to FIG. 19 may be used to combine two or more sets of emitted light segment to form a patterned light beam such as patterned light beam 215 shown in FIG. 2.

According to one particular embodiment of the invention a light combiner 1950 is used to combine a first set of emitted light segments having n' emitted light segments with a second set of emitted light segments also having n' emitted light segments, thereby forming a patterned light beam having 2 n' emitted light segments where n' is preferably at least 1, more preferably at least 2, even more preferably at least 3, and even more preferably at least 4. In one particular embodiment of the invention, n' is 8.

Figure 21:
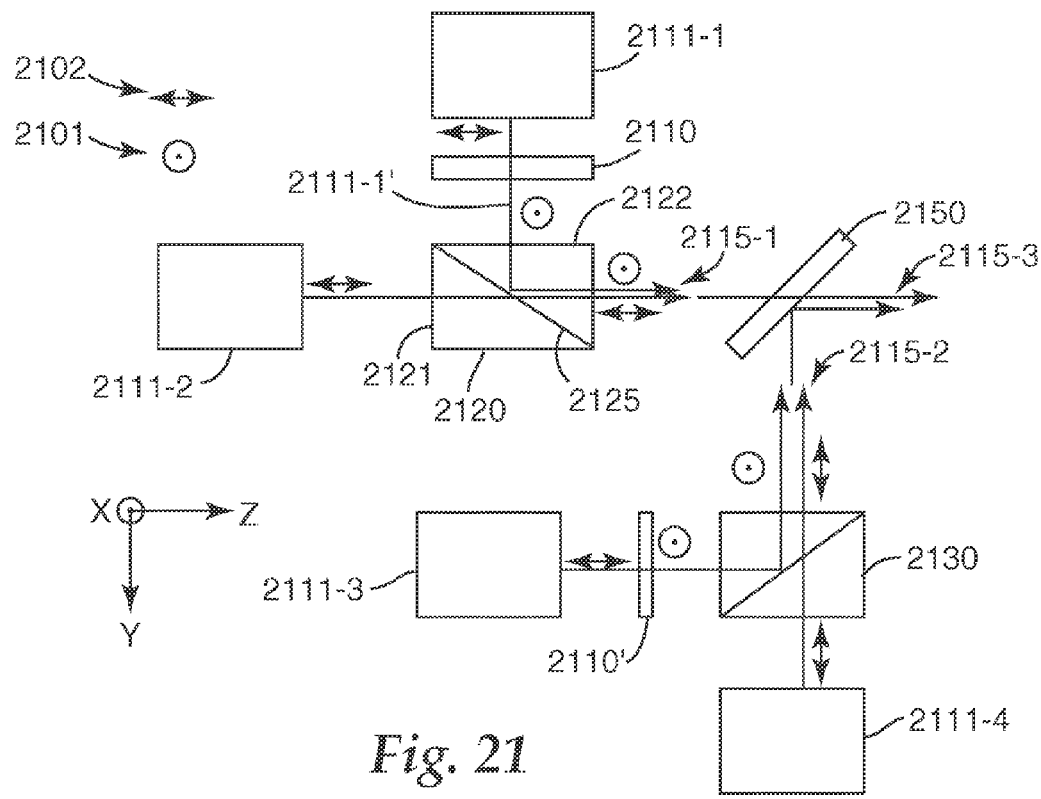
FIG. 21 illustrates a schematic top-view of polarizing beam combiners combining different sets of emitted light segments.

FIG. 21 illustrates a schematic top-view of a different method of combining two or more sets of emitted light segments to form a larger set of emitted light segments in accordance with another embodiment of the invention. In particular, FIG. 21 shows a first set of emitted light segments 2111-1 propagating along the y-direction, and a second set of emitted light segments 2111-2 propagating along the z-direction. Light in each set is polarized. For example, each set has a linearly oriented parallel polarization, meaning that the direction of polarization is in the yz-plane as denoted by symbol 2102. FIG. 21 further shows a retarder element 2110 placed in the path of set 2111-1 to change the direction of polarization from parallel to perpendicular, thereby forming a first set 2111-1' having a perpendicular polarization, where by perpendicular polarization it is meant that the direction of polarization is along the x-axis (perpendicular to the yz-plane) as denoted by symbol 2101.

FIG. 21 further shows a polarizing beam combiner 2120 that uses the difference between the parallel and perpendicular polarizations to combine the first and the second sets. For example, FIG. 21 shows a cubic polarizing beam combiner 2120 having an input face 2121 for receiving light from the second set and an input face 2122 for receiving light from the first set. Polarizing beam combiner 2120 has a hypotenuse 2125 having a property of reflecting light having a perpendicular polarization and transmitting light having a parallel transmission. As such, polarizing beam combiner 2120 combines light from the first set with light from the second set by reflecting light from the first set and transmitting light from the second set, thereby forming a patterned light beam 2115-1. Patterned light beam 2115-1 can, for example, be patterned light beam 215 in FIG. 2.

Polarizing hypotenuse 2125 may be any polarizing element capable of reflecting light having a first polarization and transmitting light having a second polarization, where the first and second polarizations are different. For example, polarizing hypotenuse 2125 may be a multilayer dielectric film as described, for example, in U.S. Pat. No. 2,403,731. Polarizing hypotenuse 2125 may be a multilayer organic optical film or a wire-grid polarizer previously described in, for example, U.S. Pat. No. 6,486,997. In general, polarizing beam combiner 2120 can be any polarization sensitive element capable of reflecting light of one polarization and transmitting light of a different polarization.

In one embodiment of the invention, the emitted light segments of first set 2111-1 are substantially aligned, along the x-axis, with the emitted light segments of second set 2111-2 so that when combined by beam combiner 2120, corresponding segments from the two sets substantially overlap. In another embodiment of the invention, the emitted light segments of first set 2111-1 are offset, along the x-axis, relative to the emitted light segments of second set 2111-2 so that when combined by beam combiner 2120, the number of emitted light segments in patterned light beam 2150 is the total number of emitted light segments in the first and second sets. Patterned light beam 2150 can, for example, be patterned light beam 215 in FIG. 2.

If desirable, a polarizing beam combiner 2130, similar to polarizing beam combiner 2120, can be used to combine light from a third set of emitted light segments 2111-3 (going through retarder 2110') with a fourth set of emitted light segments 2111-4 to form a patterned light beam 2115-2, where patterned light beam 2115-2 can, for example, be patterned light beam 215 in FIG. 2.

In one embodiment of the invention, a light combiner 2150, similar to light combiner 1950 of FIG. 19, may be used to combine patterned light beams 2115-1 and 2115-2 to form a patterned light beam 2115-3.

Figure 22:
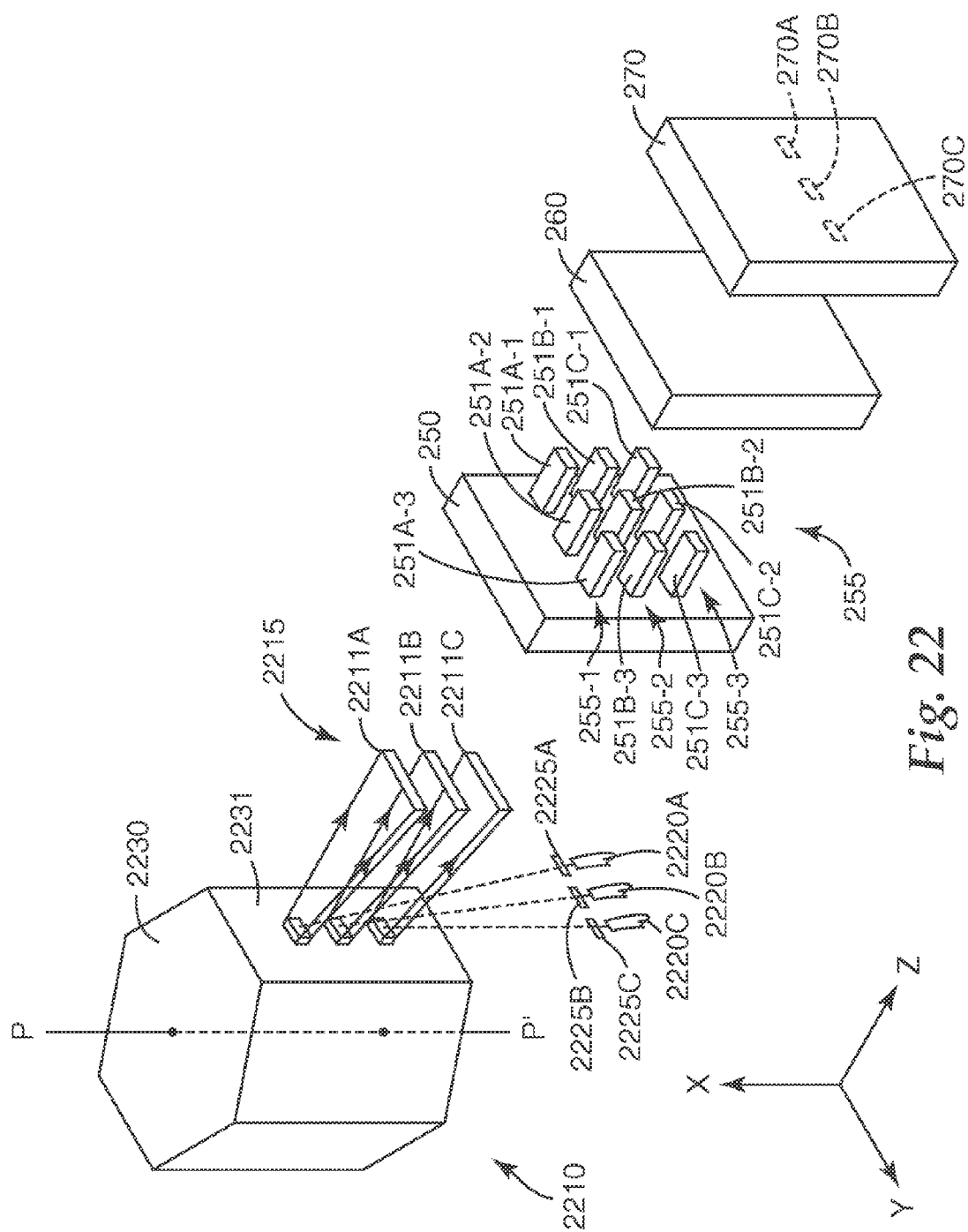
FIG. 22 illustrates a schematic three-dimensional view of a light source and a part of an imaging system in accordance with one embodiment of the invention.

FIG. 22 illustrates a light source 2210 in accordance with another embodiment of the invention. FIG. 22 also shows a portion of imaging system 200 for ease of illustration. Light source 2210 can, for example, be light source 210 shown in FIG. 2. Light source 2210 includes multiple, for example, three light emitting devices 2220A, 2220B, and 2220C. Each of the light emitting devices may, for example, be a light guide source, such as a fiber light source. For example, each light emitting device may be an optical fiber coupled to an output of a laser. As such, output light of light emitting devices 2220A, 2220B, and 2220C may be polarized.

Light source 2210 further includes light collimating lens assemblies 2225A, 2225B, and 2225C for collimating or partially collimating the output light of the light emitting devices in one or more directions. In addition, the light collimating lens assemblies 2225A, 2225B, and 2225C may perform additional functionalities such as beam shaping, polarizing, retarding, or any other function that may be desirable to perform on the output of the light emitting devices.

Light source 2210 further includes a scanner 2230 that receives output light of each of the light emitting devices and scans each received light output across mask 250. The exemplary scanner shown in FIG. 22 is a polygon-shaped mirror 2230 fast-rotating around PP', a central axis of the mirror. Each side 2231 of polygon-shaped mirror 2230 has a high specular optical reflection. As polygon-shaped mirror 2230 rotates, it forms a patterned light beam 2215 which includes emitted light segments 2211A, 2211B, and 2211C. Patterned light beam 2215 can, for example, be patterned light beam 215 of FIG. 2, in which case, emitted light segments 2211A, 2211B, and 2211C can be emitted light segments 211A, 211B, and 211C. Emitted light segments 2211A, 2211B, and 2211C can eventually (for example, after going through a light homogenizer 230) be received and patterned by mask 250.

Other types of light scanners can be used to scan light output of light emitting devices 2220A, 2220B, and 2220C. Exemplary light scanners include galvanometer mirrors (broadband or resonant), holographic scanners, electro-optic scanners, acousto-optic scanners, opto-mechanical scanners, or any other scanning method that may be suitable for forming discrete emitted light segments.

According to one embodiment of the invention, two or more imaging systems can be used to simultaneously pattern a display component, where, for example, each imaging system patterns a different area of the display component.

Referring back to FIG. 9, after processing a transfer film 905 by transferring sufficient portions of donor film 910, a processed transfer film 905 may be replaced with an unprocessed transfer film 905 to continue the transfer process. A replacement may be achieved by removing a discrete sheet of a processed transfer film 905 and placing an unprocessed transfer film 905 in its place. As such, patterning a display component may be achieved by using sheets of transfer film 905. As an alternative, transfer film 905 may be provided in a continuous form, such as a continuous roll, in which case, a portion of the continuous roll may be placed in position to be processed, as shown in FIG. 9, and once the portion in position is processed, the roll can be indexed forward to place an unprocessed portion of the roll in position for processing.

In some applications, it may be desirable or necessary to carry out a transfer of a transferable material from carrier film 920 to substrate 270 in an inert environment, meaning, for example, in argon or nitrogen environment rather than, for example, in air. This may be so because transferable film 905 may include materials or layers that may, for example, undergo an undesirable chemical reaction in the presence of, for example, oxygen when illuminated with sufficiently intense light. Furthermore, in some applications, some or all handling, including processing, of transfer film 950 may need to be performed in an inert environment.

All patents, patent applications, and other publications cited above are incorporated by reference into this document as if reproduced in full. While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. An optical imaging system for selective thermal transfer of a material from a donor film to a substrate, the optical imaging system comprising:
    a light source capable of emitting a patterned light beam, the patterned light beam including two or more emitted light segments, each emitted light segment having a first uniformity along a first direction;
    a light homogenizer receiving the two or more emitted light segments from an input face of the light homogenizer, the light homogenizer homogenizing each emitted light segment and transmitting a corresponding homogenized light segment from an output face of the light homogenizer, each transmitted homogenized light segment having a second uniformity along the first direction, the second uniformity of each transmitted homogenized light segment being greater than the first uniformity of each corresponding emitted light segment;
    a first mask having at least twenty optically transmissive areas, each optically transmissive area having a length along the first direction that varies between first and second values and a height along a second direction, the first mask receiving and patterning each transmitted homogenized light segment into a row of at least twenty discrete light subsegments along the first direction; and
    a lens system projecting light patterned by the mask onto a transfer plane so as to form a projected array of discrete projected light segments in the transfer plane, such that when a donor film that includes a transferable material disposed proximate a carrier, is placed proximate a substrate that lies in the transfer plane, each of the discrete projected light segments is capable of inducing a transfer of the transferable material from the carrier onto the substrate.

2. The optical imaging system of claim 1, wherein the length of each optically transmissive area varies continuously between the first and second values.

3. The optical imaging system of claim 1, wherein the length of each optically transmissive area varies in discrete steps between the first and second values.

4. The optical imaging system of claim 1, wherein an internal optical transmittance of each optically transmissive area is at least 99.9%.

5. The optical imaging system of claim 1 further having a second mask disposed between the light homogenizer and the first mask.

* * * * *

UNITED STATES PATENT AND TRADEMARK OFFICE
CERTIFICATE OF CORRECTION

PATENT NO. : 7,330,240 B2  
APPLICATION NO. : 11/464643  
DATED : February 12, 2008  
INVENTOR(S) : William A. Tolbert Page 1 of 1

It is certified that error appears in the above-identified patent and that said Letters Patent is hereby corrected as shown below:

Column 9,  
Line 17, after "$\alpha'_1$" delete ",".

Column 19,  
Line 53, delete "$W_e$" and insert -- $w_e$ --, therefor.

Column 20,  
Line 32, delete "$\alpha''_1$." and insert -- $\alpha''_1$. --, therefor.

Column 23,  
Line 9, delete "2 n'" and insert -- 2n' --, therefor.

Column 24,  
Line 47, delete "221IC" and insert -- 2211C --, therefor.

Signed and Sealed this

Twenty-second Day of July, 2008

JON W. DUDAS  
*Director of the United States Patent and Trademark Office*